United States Patent
Tsuda

(10) Patent No.: US 12,085,853 B2
(45) Date of Patent: Sep. 10, 2024

(54) TEMPLATE, PATTERN FORMING METHOD, AND SEMICONDUCTOR DEVICE MANUFACTURING METHOD

(71) Applicant: Kioxia Corporation, Tokyo (JP)

(72) Inventor: Hirotaka Tsuda, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 11 days.

(21) Appl. No.: 18/172,540

(22) Filed: Feb. 22, 2023

(65) Prior Publication Data

US 2023/0418155 A1    Dec. 28, 2023

(30) Foreign Application Priority Data

Jun. 22, 2022   (JP) .................................. 2022-100316

(51) Int. Cl.
*G03F 7/00*   (2006.01)
*B29C 59/02*  (2006.01)

(52) U.S. Cl.
CPC .......... *G03F 7/0002* (2013.01); *B29C 59/026* (2013.01)

(58) Field of Classification Search
CPC ............................. G03F 7/0002; B29C 59/029
See application file for complete search history.

(56) References Cited

U.S. PATENT DOCUMENTS

| 7,922,960 | B2* | 4/2011 | Hiroshima | G03F 7/0002 264/496 |
| 2014/0072668 | A1* | 3/2014 | Yoneda | B29C 59/02 428/157 |
| 2015/0158240 | A1 | 6/2015 | Haase et al. | |
| 2016/0091788 | A1 | 3/2016 | Aritsuka et al. | |
| 2018/0259862 | A1* | 9/2018 | Cho | G03F 7/0002 |

FOREIGN PATENT DOCUMENTS

| JP | 2012009686 | A  | * | 1/2012 | ............. B29C 33/38 |
| JP | 6060796    | B2 |   | 1/2017 | |
| JP | 6115300    | B2 |   | 4/2017 | |
| JP | 6571656    | B2 |   | 9/2019 | |
| WO | WO-2015/133102 | A1 | | 9/2015 | |

OTHER PUBLICATIONS

Machine English translation of JP2012009686(A) (Year: 2012).*

* cited by examiner

*Primary Examiner* — Jessica M Roswell
(74) *Attorney, Agent, or Firm* — Foley & Lardner LLP

(57) ABSTRACT

A template includes a first region having a first face on a side opposite to a main face and a first pattern including a convex-concave portion provided on the first face, and a second region, provided around the first region, having a second face on the side opposite to the main face, a second pattern including a protruding portion protruding from the second face, and an optical layer provided on the second face and the second pattern, wherein the second face is positioned farther to the main surface side than a bottom-most face of the irregular portion.

14 Claims, 26 Drawing Sheets

TEMPLATE, PATTERN FORMING METHOD, AND SEMICONDUCTOR DEVICE MANUFACTURING METHOD

CROSS-REFERENCE TO RELATED APPLICATION(S)

This application is based upon and claims the benefit of priority from Japanese Patent application No. 2022-100316, filed Jun. 22, 2022, the entire contents of which are incorporated herein by reference.

FIELD

Embodiments described herein relate generally to a template, a pattern formation method, and a semiconductor device manufacturing method.

BACKGROUND

Technology whereby a fine pattern is formed using nanoimprint lithography (NIL) is known as a semiconductor device manufacturing method.

DETAILED DESCRIPTION

Figure 1:
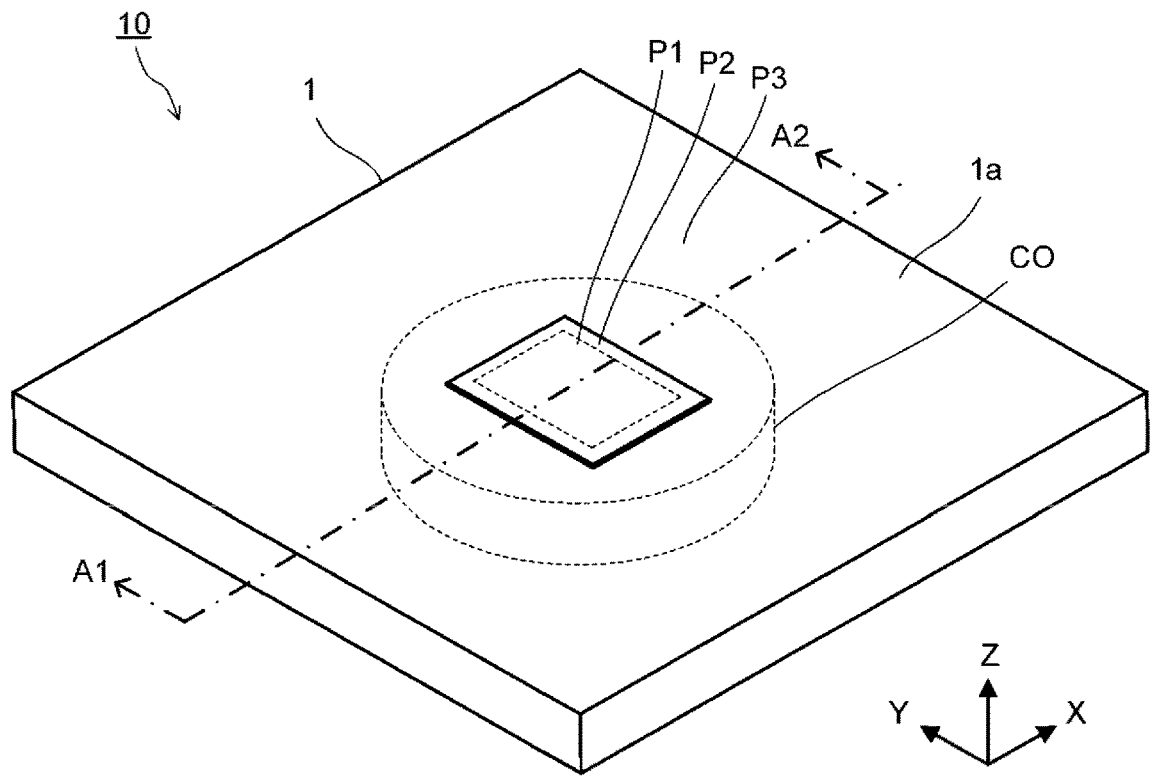
FIG. 1 is a perspective schematic view illustrating an example of a structure of a template of a first embodiment.

Embodiments provide at least one of a template, a pattern formation method, and a semiconductor device manufacturing method such that a desired pattern can be formed with high accuracy.

In general, according to at least one embodiment, a template includes a first region having a first face on a side opposite to a main face and a first pattern including a convex-concave portion provided on the first face, and a second region, provided around the first region, having a second face on the side opposite to the main face, a second pattern including a protruding portion protruding from the second face, and an optical layer provided on the second face and the second pattern, wherein the second face is positioned farther to the main surface side than a bottommost face of the irregular portion.

Hereafter, embodiments will be described with reference to the drawings. A relationship between a thickness and planar dimensions of each element shown in the drawings, a ratio of element thicknesses, and the like, may differ from actual values. Also, in the embodiments, identical reference signs are allotted to elements that are substantially identical, and a description is omitted as appropriate.

A pattern formation method in which NIL is used is such that a pattern (a template) is pressed onto a coating layer of an imprint material such as an ultraviolet curable resin provided on a target object, and the coating layer is cured by irradiating with light such as ultraviolet light, whereby a device pattern is transferred to the imprint material layer.

First Embodiment

Figure 2:
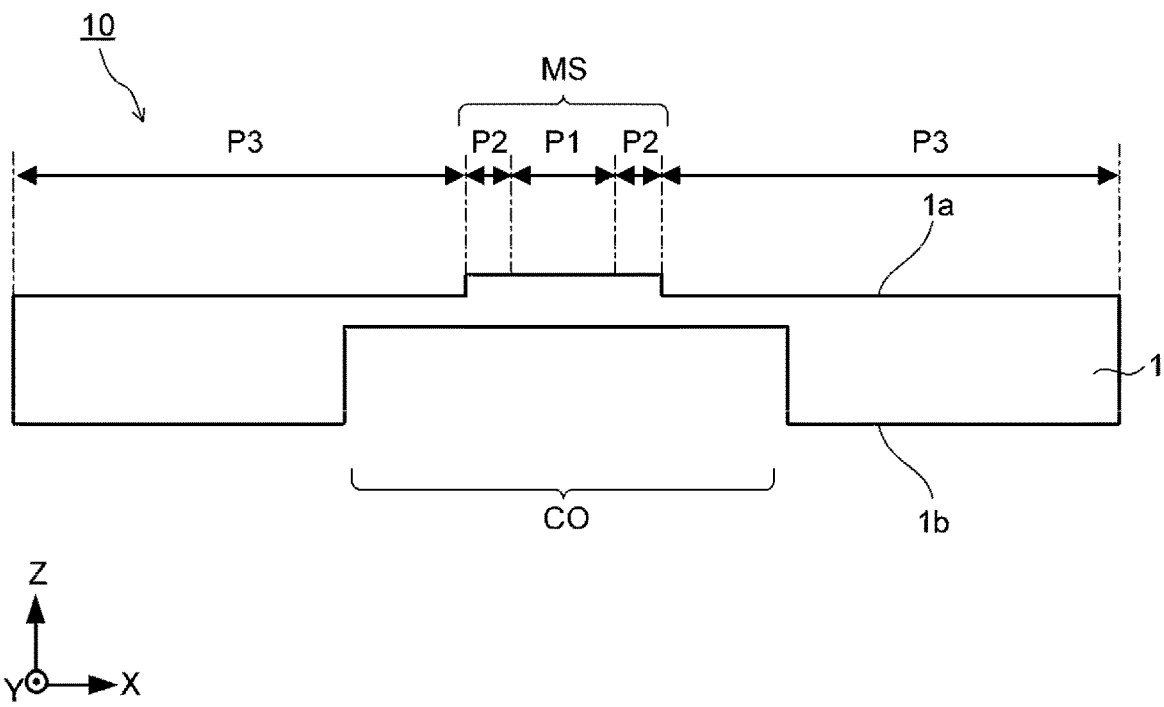
FIG. 2 is a sectional schematic view illustrating an example of a structure of the template of the first embodiment.

FIG. 1 is a perspective schematic view illustrating an example of a structure of a template of a first embodiment. FIG. 2 is a sectional schematic view illustrating an example of a structure of the template of the first embodiment. FIGS. 1 and 2 show an X-axis, a Y-axis perpendicular to the X-axis, and a Z-axis perpendicular to each of the X-axis and the Y-axis. FIG. 2 shows one portion of a cross-section of a line segment A1-A2 shown in FIG. 1.

As shown in FIGS. 1 and 2, a template 10 has a substrate 1 having a surface 1a, which includes a mesa MS, and a surface 1b, which includes a concave portion CO. The mesa MS is a portion in which a device pattern is formed. The surface 1a has a region P1, a region P2, and a region P3. The region P1 and the region P2 are regions forming the mesa MS. The region P3 is a region of the surface 1a peripheral to the mesa MS. Although not particularly limited, a planar form of the mesa MS is, for example, rectangular. The surface 1b is a main surface.

Figure 3:
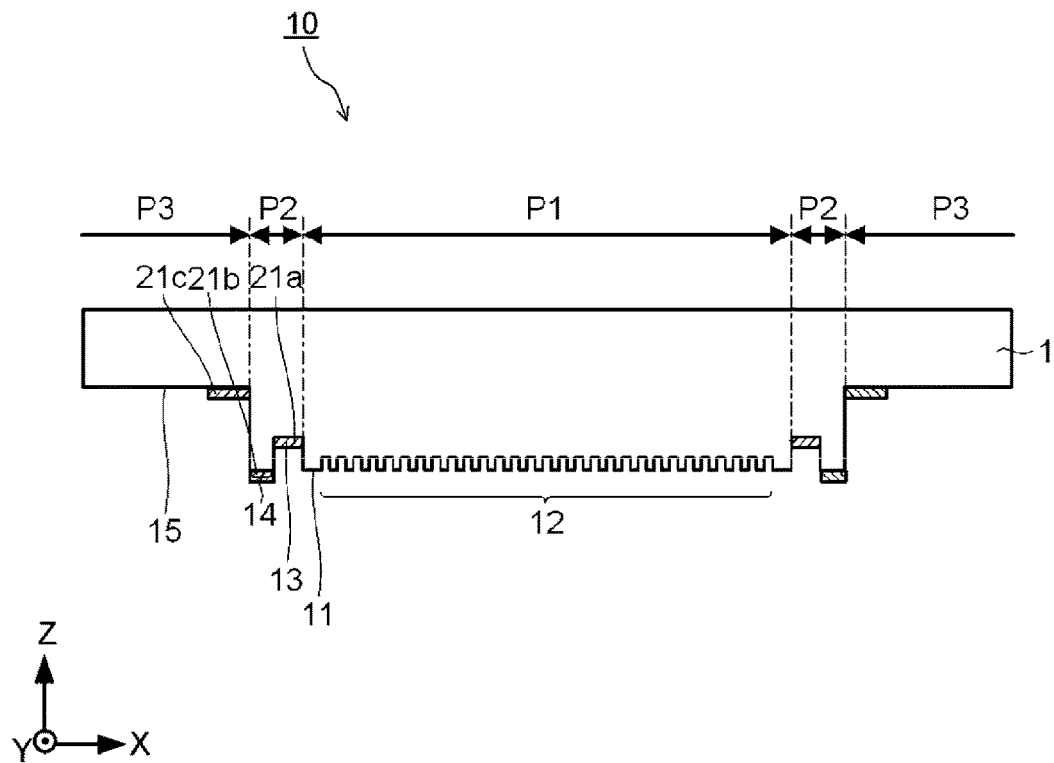
FIG. 3 is a sectional schematic view illustrating an example of a structure of the template of the first embodiment.
Figure 4:
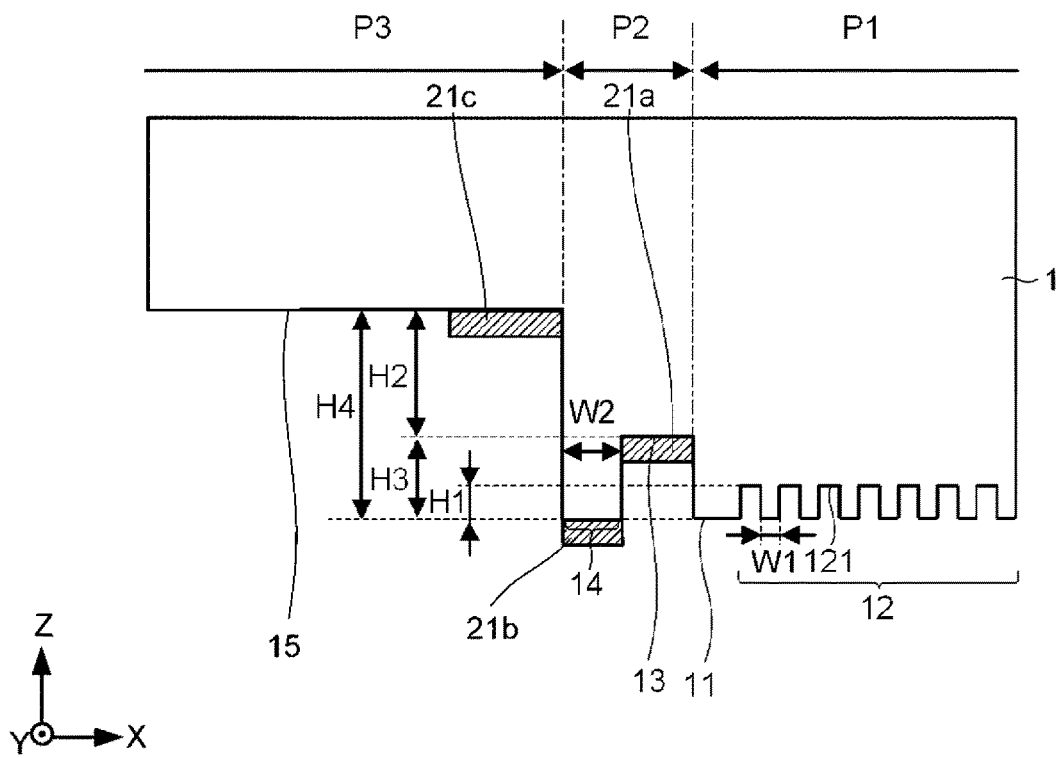
FIG. 4 is an enlarged schematic view showing one portion of FIG. 3.

FIG. 3 is a sectional schematic view illustrating an example of a structure of the template 10 of the first embodiment. FIG. 3 shows a section including the X-axis of the template 10 and the Z-axis of the template 10. FIG. 4 is an enlarged schematic view showing one portion of FIG. 3.

A lower side of the substrate 1 in FIG. 3 represents an upper portion of the substrate 1, and an upper side of the substrate 1 in FIG. 3 represents a lower portion of the substrate 1.

The substrate 1 contains a first material having a first optical constant with respect to light for curing a coating layer. The first material includes, for example, quartz. The substrate 1 preferably transmits the aforementioned light.

As shown in FIG. 3, the region P1 has a face 11 and a convex-concave portion 12. The face 11 is provided on a side opposite to the surface 1b. The face 11 corresponds to an outermost face of the substrate 1 before processing. The irregular portion 12 is provided on the face 11.

The irregular portion 12 forms a device pattern. A device pattern is a pattern transferred using a pattern formation method in which NIL is used, and is a pattern for forming at least one element of a semiconductor device. A device pattern form is not particularly limited. Neither of a height H1 of a protruding portion from a bottom face 121 of the irregular portion 12, or a width W1 of the protruding portion, is particularly limited, but is, for example, less than 500 nm. The bottom face 121 is a bottommost face of a deepest concave portion among concave portions in the irregular portion 12.

As shown in FIG. 3, the region P2 is provided around the region P1 as seen from an X-Y plane. As shown in FIG. 3, the region P2 has a face 13, a protruding portion 14, and an optical layer 21 (21a, 21b, and 21c).

The face 13 is provided on a side opposite to the surface 1b. As shown in FIG. 4, the face 13 is provided farther downward (to the surface 1b side) than the bottom face 121 of the irregular portion 12 when the face 11 is a reference face. Because of this, an arrangement can be such that when the template 10 is pressed against a coating layer and the irregular portion 12 comes into contact with the coating layer, the coating layer does not come into contact with the face 13. When the mesa MS is formed in one level, the face 13 is provided, for example, farther to an inner side than a peripheral edge portion of the region P2 (a peripheral edge portion of the mesa MS), and does not overlap the peripheral edge portion of the region P2. A height H3 of the face 11 from the face 13 is not particularly limited, but is, for example, 1 μm or greater, 5 μm or less.

The protruding portion 14 is provided protruding from the face 13. The protruding portion 14 forms a dummy pattern. A form of the dummy pattern is not particularly limited, provided that the form has the protruding portion 14. A line and space pattern, a pillar pattern, and the like, are suggested as examples of a dummy pattern.

Figure 5:
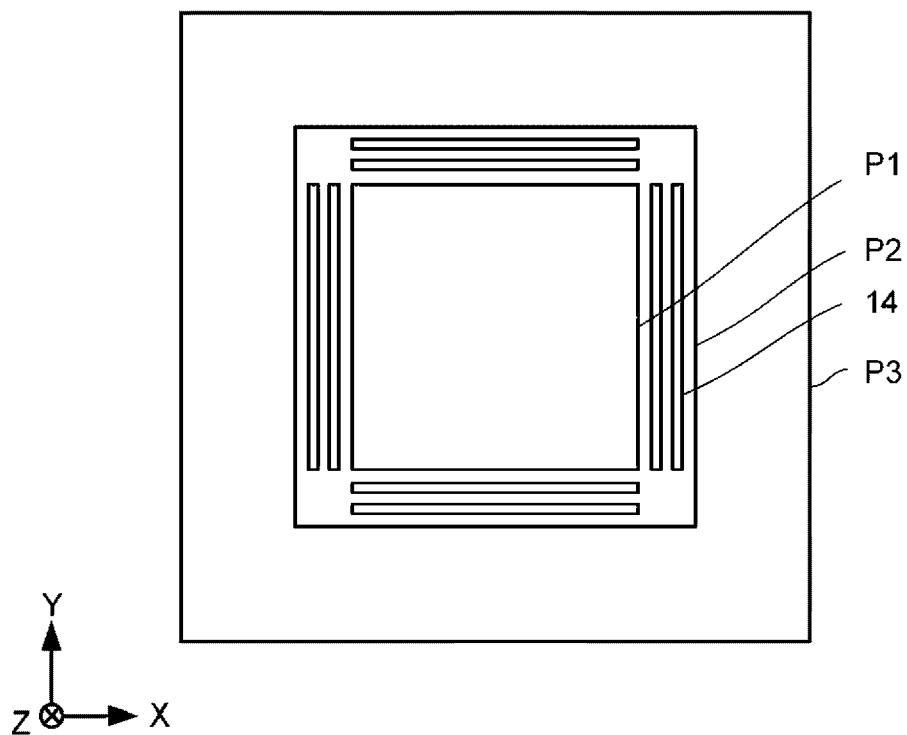
FIG. 5 is an upper schematic view showing an example of a dummy pattern layout.
Figure 6:
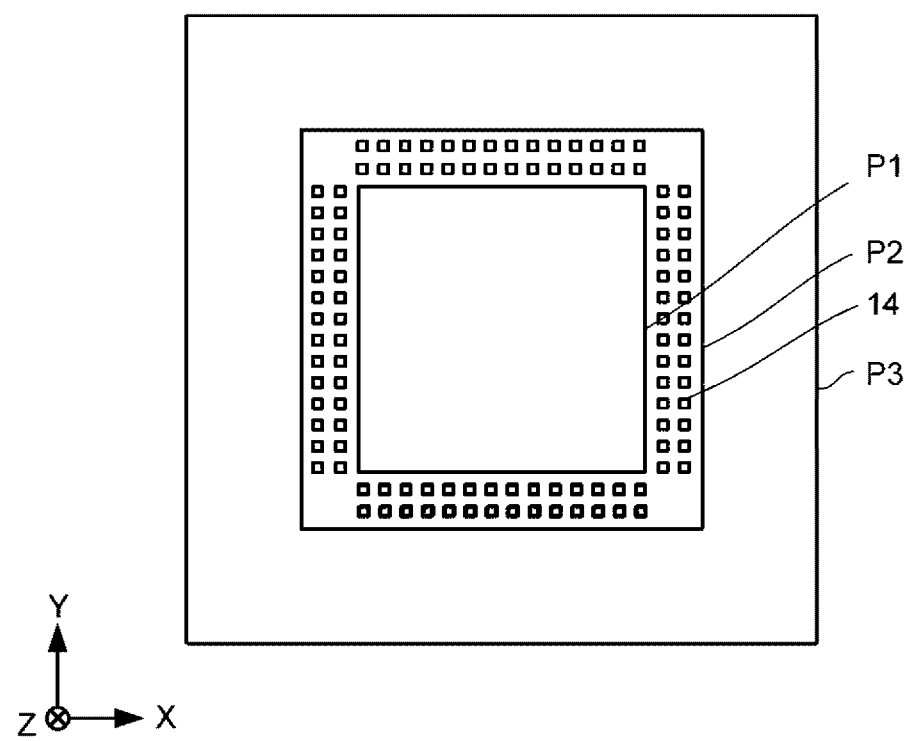
FIG. 6 is an upper schematic view showing an example of a dummy pattern layout.

FIGS. 5 and 6 are upper schematic views showing examples of a dummy pattern layout. A dummy pattern shown in FIG. 5 is an example of a line and space pattern, has a multiple of linear protruding portions 14 disposed on four sides of the region P1, and two linear protruding portions 14 extend in directions parallel to each side of the region P1. A dummy pattern shown in FIG. 6 is an example of a pillar pattern, has a multiple of pillar-form protruding portions 14 disposed on four sides of the region P1, and fourteen pillar-form protruding portions 14 are arrayed in each of two lines in directions parallel to each side of the region P1.

A width W2 of the protruding portion 14 is not particularly limited, but is, for example, or greater, 5 μm or less. In FIG. 4, the height H3 of an upper face of the protruding portion 14 from the face 13 is not particularly limited, but is, for example, 1 μm or greater, 5 μm or less. FIG. 4 shows an example wherein the height of the face 11 from the face 13 is the same height H3 as the height of the upper face of the protruding portion 14 from the face 13, but the two heights may also differ. For example, the height of the upper face of the protruding portion 14 from the face 13 may be less than the height of the face 11 from the face 13.

The optical layer 21 contains a second material having a second optical constant, differing from the first optical constant, with respect to light for curing a coating layer. The second material has at least one chosen from a group comprising chromium, molybdenum, tantalum, tungsten, zirconium, and titanium. The second materials of the optical layers 21a, 21b, and 21c may be the same as each other, or may differ. The optical layer 21 is preferably formed of, for example, a light-shielding layer that reflects the aforementioned light. Owing to the optical layer 21 being provided, curing of a portion overlapping the region P2 when the template is pressed against the coated layer and cured can be restricted.

The optical layer 21a is provided in contact with the face 13. The optical layer 21b is provided in contact with the upper face of the protruding portion 14. The optical layer 21c extends in the X direction and the Y direction from an end portion of the region P2 on a face 15. The optical layer 21 is provided in the region P2, but is not provided in the region P1. That is, while the face 13 is in contact with the optical layer 21, the face 11 and the surface of the irregular portion 12 are not in contact with the optical layer 21, and form an exposed face. The optical layer 21 is preferably provided at least between the protruding portion 14 on the face 13 and the face 11. A thickness of the optical layer 21 is preferably less than the height of the protruding portion 14 from the face 13. The thickness of the optical layer 21 when containing chromium is, for example, 15 nm or greater.

The region P3 is provided around the region P2. FIG. 3 shows one portion of the region P3 shown in FIGS. 1 and 2. The region P3 has the face 15. The face 15 is provided on the side opposite to the surface 1b. The face 15 is provided farther downward (to the surface 1b side) than the face 13, with the face 11 as a reference face. The height H2 of the face 13 from the face 15 is not particularly limited, but is, for example, 10 μm or greater, 50 μm or less. A height H4 of the face 11 from the face 15 corresponds to the sum of the height H2 and the height H3.

Figure 7:
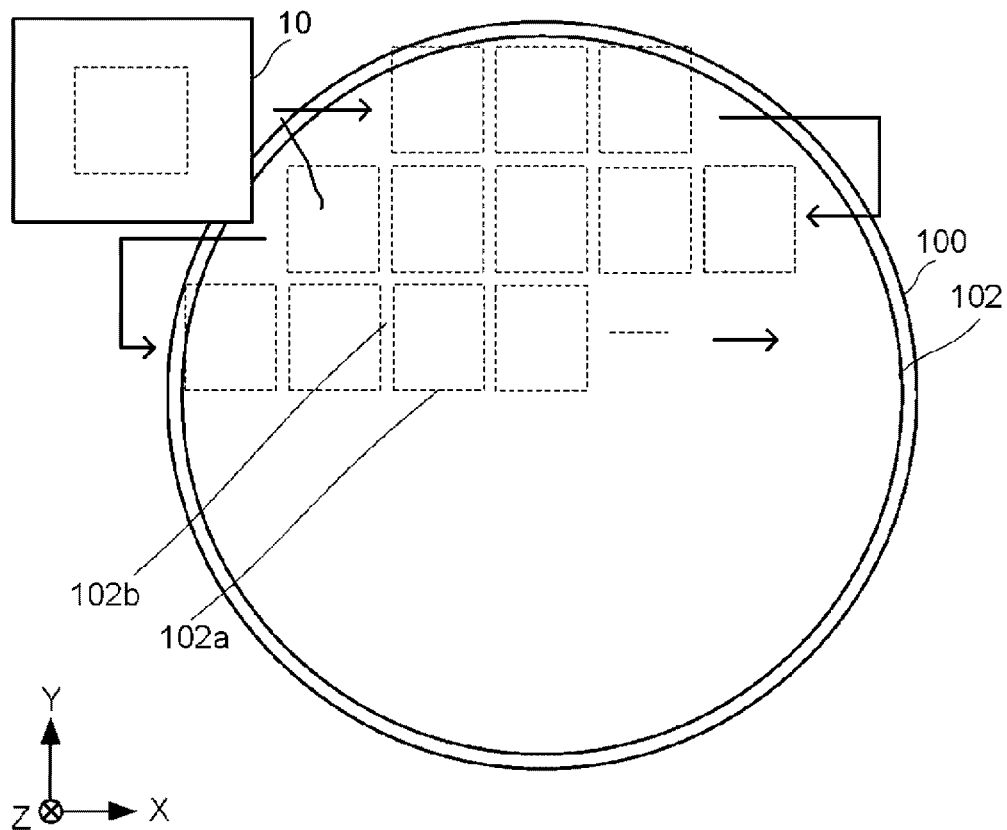
FIG. 7 is a schematic view illustrating a pattern formation method of the first embodiment.

Next, a pattern formation method in which the template 10 of the first embodiment is used will be described. FIG. 7 is a schematic view illustrating a pattern formation method. FIG. 7 shows a target object 100, a coating layer 102 on the target object 100, and the template 10.

The pattern formation method is such that, first, the coating layer 102 is formed on the target object 100. The target object 100 is, for example, a layered body formed by a multiple of films being stacked on a semiconductor substrate. A configuration of the target object 100 is not particularly limited. The coating layer 102 has an imprint material (a resist material) such as an ultraviolet curable resin. The coating layer 102 may be formed by applying an imprint material to a surface of the target object 100 using a coating method such as a spin coating method. A pattern formation method in which NIL is used is such that a fine pattern needs to be filled with the coating layer 102, because of which the coating layer 102 is supplied onto the target object 100 in a state having fluidity.

In order to transfer a good fine pattern using a pattern formation method in which NIL is used, it is important not to supply too much or too little imprint material. Methods of supplying an imprint material onto a target object are broadly divided into two, those being an ink jet method and an application method. Supply of an imprint material using an ink jet method is such that while the imprint material can be supplied to an imprinting face on a target object without excess or insufficiency by adjusting a disposition and an amount of minute resist droplets in accordance with a device pattern formed on a template, it is necessary to implement an imprint material dripping sequence using an ink jet many times, because of which throughput is unlikely to rise, and as the method is such that the imprint material is caused to be supplied to the inside of a device pattern by squashing imprint material droplets on the imprint material with a template, air bubbles caused by an atmospheric gas phase are particularly likely to occur when filling in a short time.

Meanwhile, an application method is such that an imprint material is supplied at one time onto a target object using spin coating, because of which a processing time needed for a series of imprinting sequences is short, throughput can be raised, and the imprint material can be supplied evenly onto the target object, meaning that air bubbles are unlikely to occur. An imprint material for which an application method, with which defect reduction and throughput improvement can be expected simultaneously, is used is one technique that is aimed at application to mass production using a pattern formation method in which NIL is used.

Next, the template 10 is pressed against each of a multiple of regions 102a of the coating layer 102 in, for example, the order of arrows in FIG. 7, thereby molding the region 102a, and the region 102a is cured by irradiating with light with the template 10 still pressed against the shaped region 102a. Each of the multiple of regions 102a is a portion against which the region P1 of the template 10 is pressed in one molding and curing process. A driving of at least one of the template 10 and the target object 100 is controlled u sing an unshown drive device.

Figure 8:
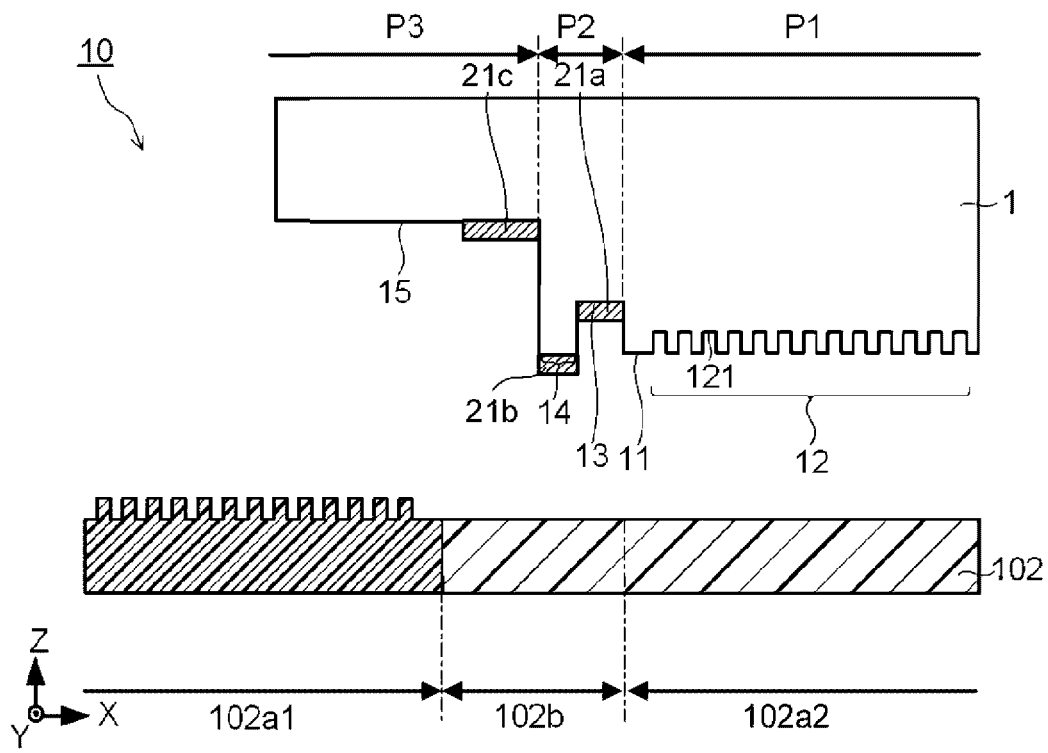
FIG. 8 is a schematic view illustrating an example of a molding and curing process using a template 10.

FIG. 8 is a schematic view illustrating an example of a molding and curing process using the template 10. FIG. 8 shows a cross-section of the coating layer 102 having the region 102a (a region 102a1) previously cured in a molding and curing process, the region 102a (a region 102a2) to be cured next before the molding and curing process, and a region 102b between the region 102a1 and the region 102a2. The region 102b is a portion against which the region P1 of the template 10 is not pressed, and in which no pattern is formed.

When an interval between the previously cured region 102a1 and the region 102a2 to be cured next is short, the template 10 (for example, a portion of the mesa MS) is liable to come into contact with the region 102a1 when the template 10 is pressed against the region 102a2. The region 102a1 is cured, meaning that when the template 10 comes into contact with the region 102a1, the template 10 inclines, for example, and it becomes difficult to shape the region 102a2 into a desired form. In response to this, the interval between the region 102a1 and the region 102a2 can be widened by providing the region 102b, because of which the template 10 coming into contact with the region 102a1 when the template 10 is pressed against the region 102a2 can be restricted. The region 102b may be provided between one of the multiple of regions 102a and one other of the multiple of regions 102a, and extend in a lattice form in such a way as to enclose at least one of the multiple of regions 102a when seen from the X-Y plane, as shown in FIG. 7.

Figure 9:
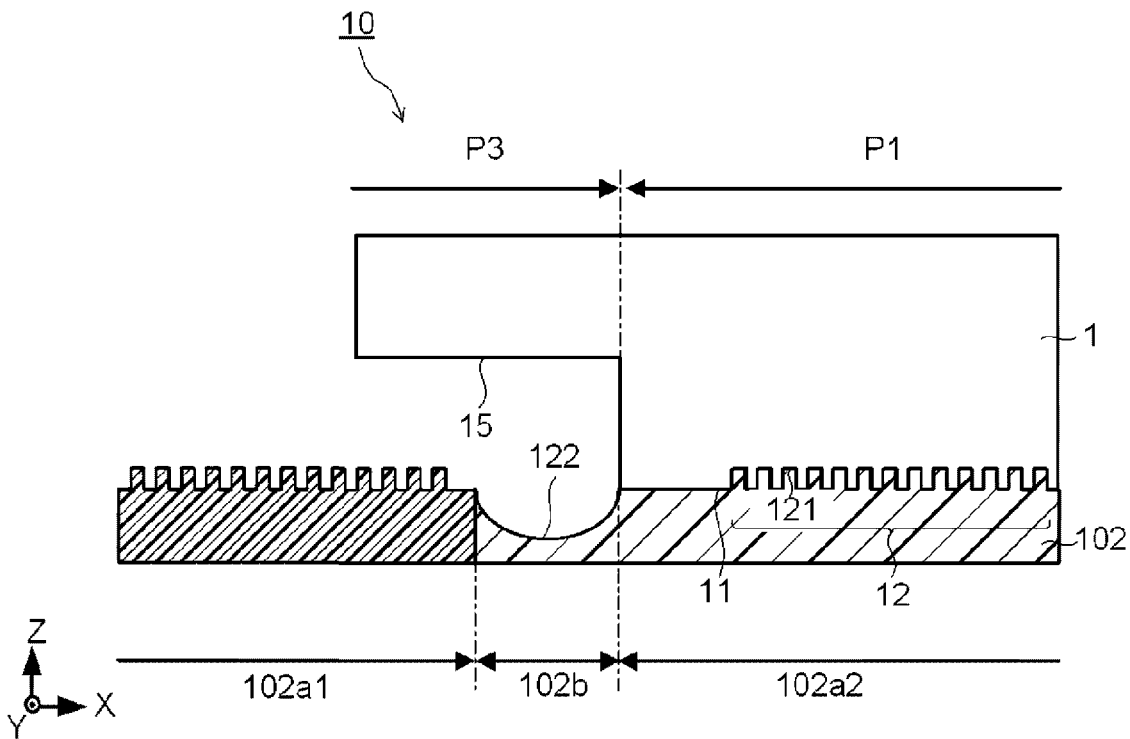
FIG. 9 is a schematic view illustrating a difference in a form of a coating layer 102 caused by a difference in a form of the template 10 when the form of the template 10 is brought into contact with the coating layer 102.
Figure 10:
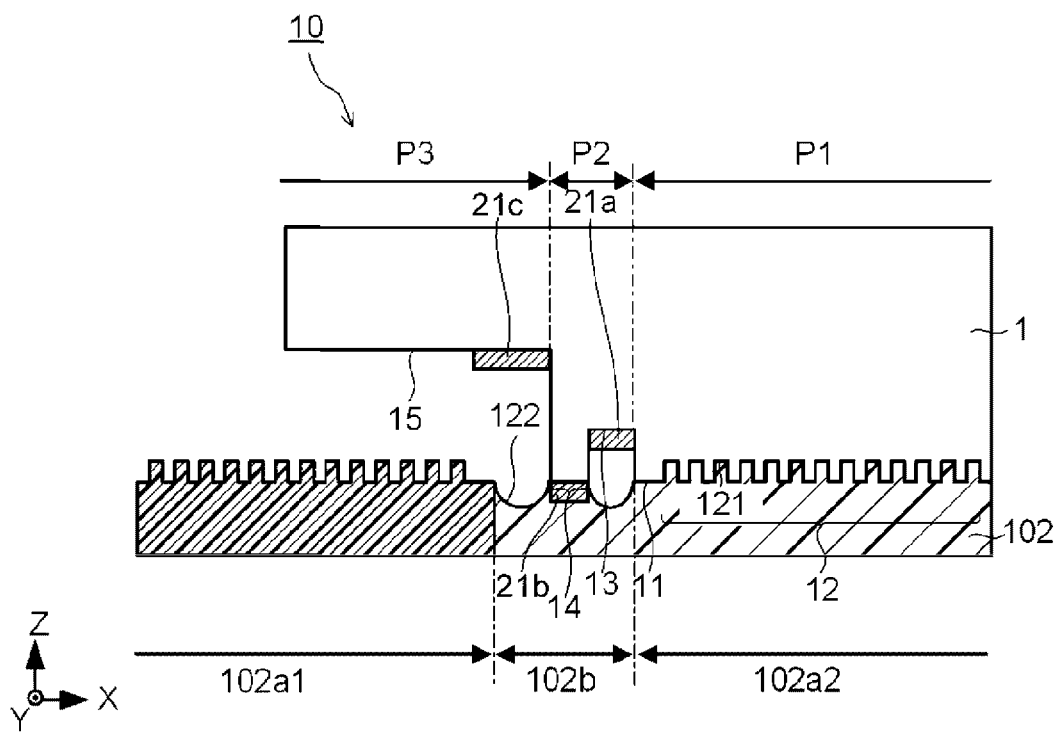
FIG. 10 is a schematic view illustrating a difference in the form of the coating layer 102 caused by a difference in the form of the template 10 when the form of the template 10 is brought into contact with the coating layer 102.

FIGS. 9 and 10 are schematic views for illustrating a difference in a form of the coating layer 102 caused by a difference in a form of the template 10 when the form of the template is brought into contact with the coating layer 102. FIGS. 9 and 10 show the coating layer 102 and the template 10.

Provisionally, when the template 10 does not have the region P2 but has the region P1 and the region P3, the region P1 comes into contact with the region 102a1 when the template 10 is pressed against the region 102a2, as shown in FIG. 9. At this time, the imprint material of the region 102b, which is not cured, is drawn toward the region P1 side by surface tension, and a depression 122 is formed. The depression 122 being deep causes the region 102b to become thinner. In this case, for example, when the target object 100 is processed using a cured layer of the coating layer 102, accuracy of processing the target object 100 may decrease.

As opposed to this, when the template 10 has the region P2, as shown in FIG. 10, the region 102a2 is shaped by the region P1 coming into contact with the region 102a2 when the template 10 is pressed against the region 102a, together with which the protruding portion 14 comes into contact with the region 102a without the face 13 coming into contact with the region 102a1, the region 102a2, and the region 102b. The protruding portion 14 is only in contact with the region 102b, and imprint material that comes into contact with the protruding portion 14 is liable to accumulate. Therefore, a drawing to one side of imprint material due to surface tension is restricted, and the depression 122 can be reduced in size or eliminated. Therefore, a decrease in thickness of the region 102b after curing can be restricted. Therefore, a desired device pattern can be formed with high accuracy.

Figure 11:
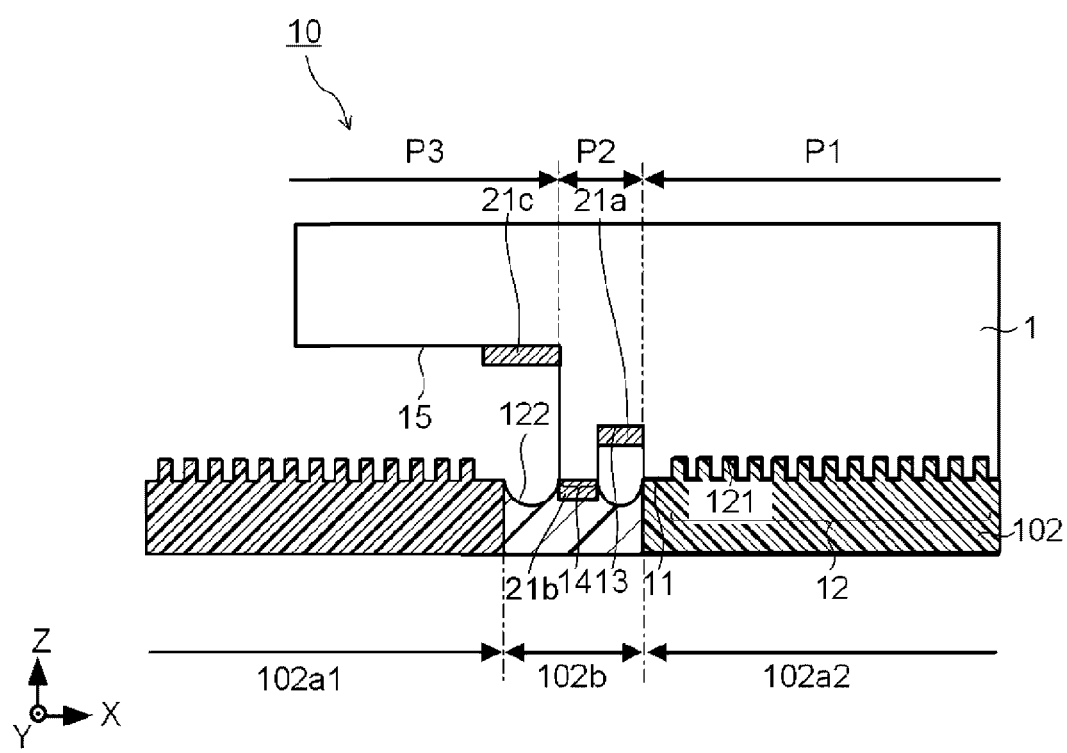
FIG. 11 is a schematic view illustrating an example of a molding and curing process using the template 10.
Figure 12:
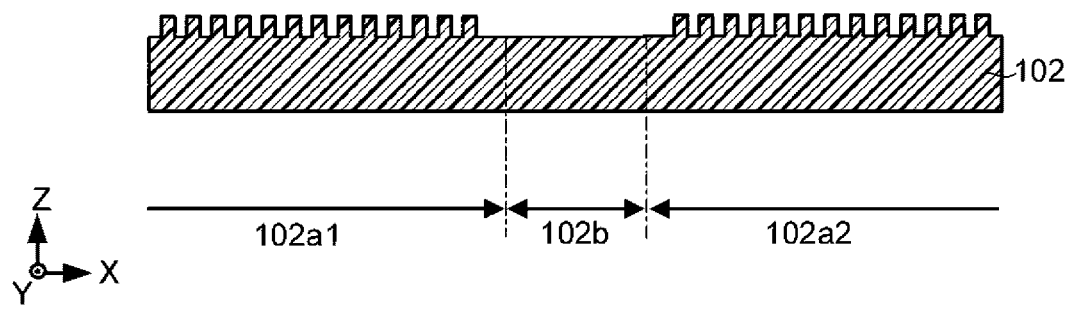
FIG. 12 is a schematic view illustrating an example of a molding and curing process using the template 10.

FIGS. 11 and 12 are schematic views for illustrating an example of a molding and curing process in which the template 10 is used. Subsequently, the region 102a2 is cured by irradiating with light with the template 10 still pressed against the shaped region 102a2, as shown in FIG. 11. At this time, curing of the region 102b can be restricted by the optical layer 21. After all the regions 102a are shaped and cured sequentially, the region 102b is cured by irradiating the region 102b with light, as shown in FIG. 12. By so doing, the device pattern can be transferred to the region 102a. The above is a description of the pattern formation method of the first embodiment.

Next, an example of a method of manufacturing the template 10 shown in FIG. 3 will be described, with reference to FIGS. 13 to 24. FIGS. 13 to 24 are sectional schematic views for illustrating a method of manufacturing the template 10 shown in FIG. 3.

Figure 13:
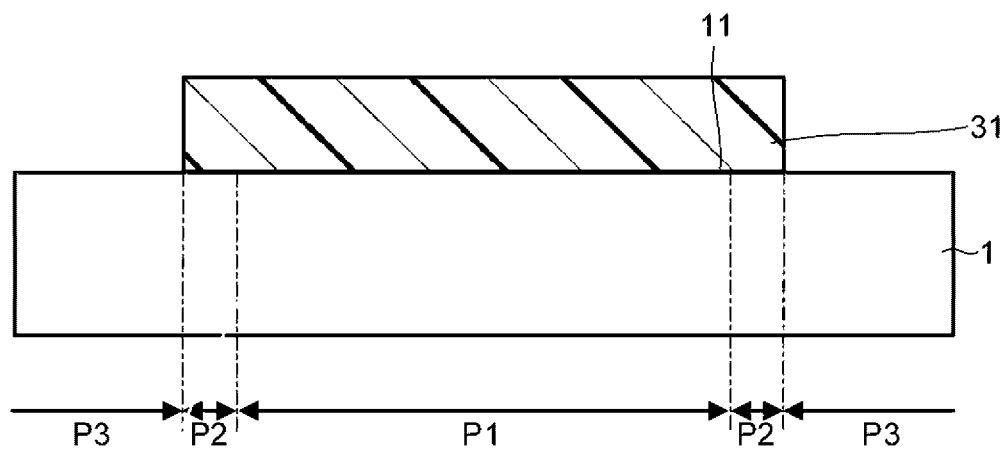
FIG. 13 is a sectional schematic view illustrating a method of manufacturing the template 10 shown in FIG. 3.

Firstly, as shown in FIG. 13, a resist mask layer 31 is formed on the face 11 of the substrate 1. The resist mask layer 31 covers the region P1 and the region P2, and causes the region P3 to be exposed. The resist mask layer 31 may be formed using, for example, a pattern formation method in which NIL is used.

Figure 14:
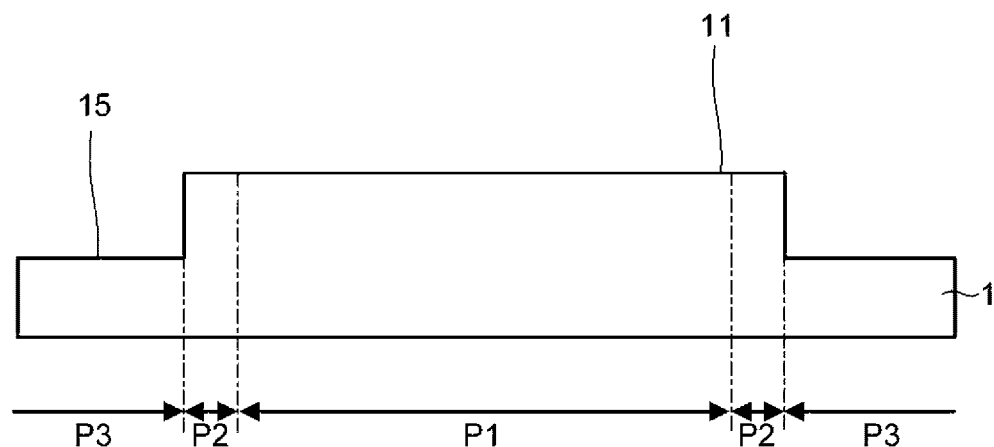
FIG. 14 is a sectional schematic view illustrating a method of manufacturing the template 10 shown in FIG. 3.

Next, one portion of the substrate 1 is removed in a thickness direction by an etching in which the resist mask layer 31 is used as a mask, whereby the mesa MS, including the region P1 and the region P2, and the face 15 are formed, and the resist mask layer 31 is removed, as shown in FIG. 14. The substrate 1 may be partially removed using an anisotropic etching, such as a reactive ion etching or a dry etching. Dry etching that processes the substrate 1 is, for example, an inductively coupled plasma reactive ion etching in which trifluoromethane ($CHF_3$) gas is used. The formation of the mesa MS and the surface 15 is not limited to dry etching, but also may be processed, for example, by wet etching using chemicals.

Figure 15:
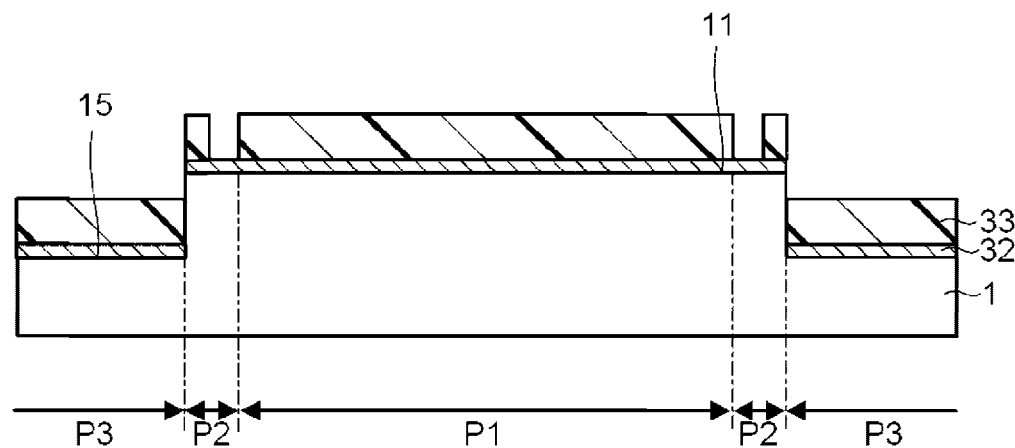
FIG. 15 is a sectional schematic view illustrating a method of manufacturing the template 10 shown in FIG. 3.
Figure 15:
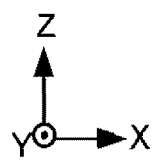

Next, as shown in FIG. 15, a hard mask layer 32 is formed on the face 11 and the face 15, and a resist mask layer 33 is formed on the hard mask layer 32.

The hard mask layer 32 has a function as a hard mask for processing the substrate 1. The hard mask layer 32 contains, for example, chromium. The hard mask layer 32 can be formed using, for example, sputtering or atomic layer deposition (ALD).

The resist mask layer 33 has a function as a resist mask for processing the hard mask layer 32. The resist mask layer 33 has a pattern that causes a portion of the hard mask layer 32 coinciding with a partial region of the face 11 of the region P2 to be exposed. The resist mask layer 33 is formed using, for example, a pattern formation method in which NIL is used.

Figure 16:
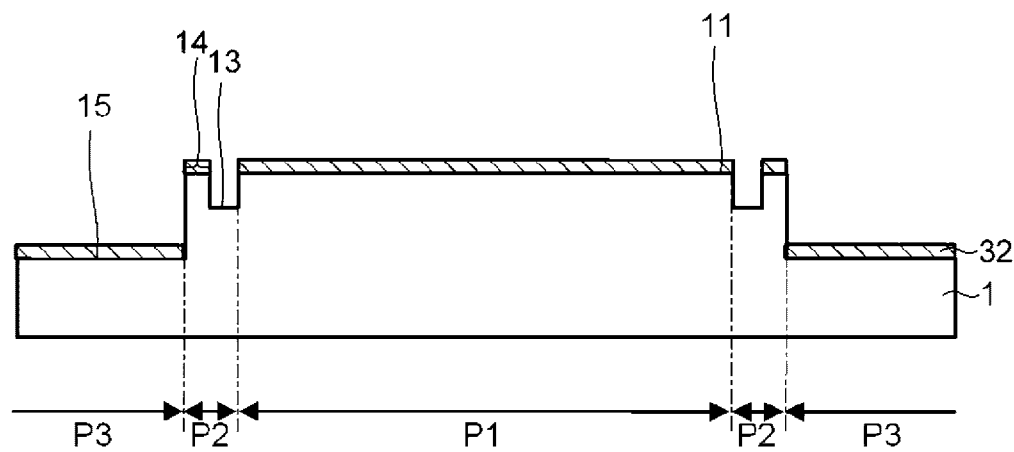
FIG. 16 is a sectional schematic view illustrating a method of manufacturing the template 10 shown in FIG. 3.
Figure 16:
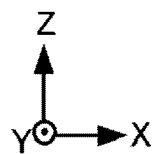

Next, an exposed portion of the hard mask layer 32 is removed, and one portion of the substrate 1 is removed in the thickness direction by an etching in which the hard mask layer 32 and the resist mask layer 33 are used as masks, whereby a dummy pattern including the face 13 and the protruding portion 14 is formed in the region P2, and the resist mask layer 33 is removed, as shown in FIG. 16. The substrate 1 may be partially removed using RIE, dry etching, or the like.

Figure 17:
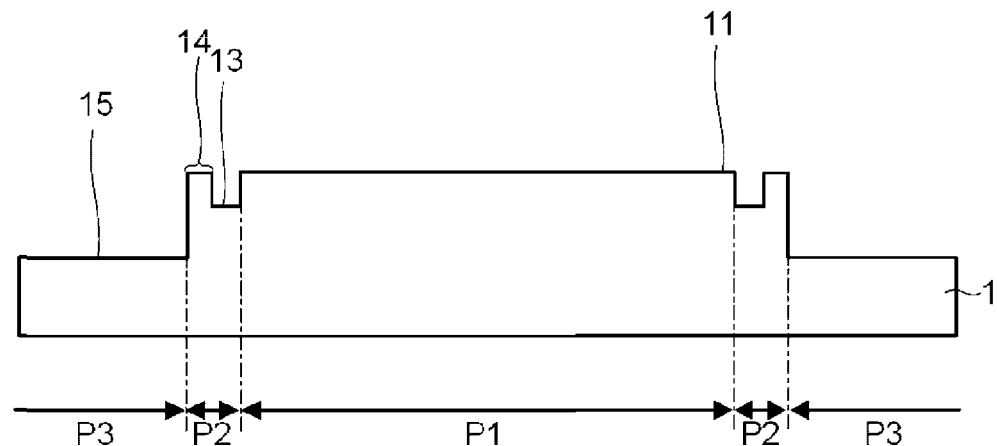
FIG. 17 is a sectional schematic view illustrating a method of manufacturing the template 10 shown in FIG. 3.
Figure 17:
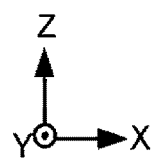

Next, as shown in FIG. 17, the hard mask layer 32 is removed. The hard mask layer 32 may be removed by, for example, etching.

Figure 18:
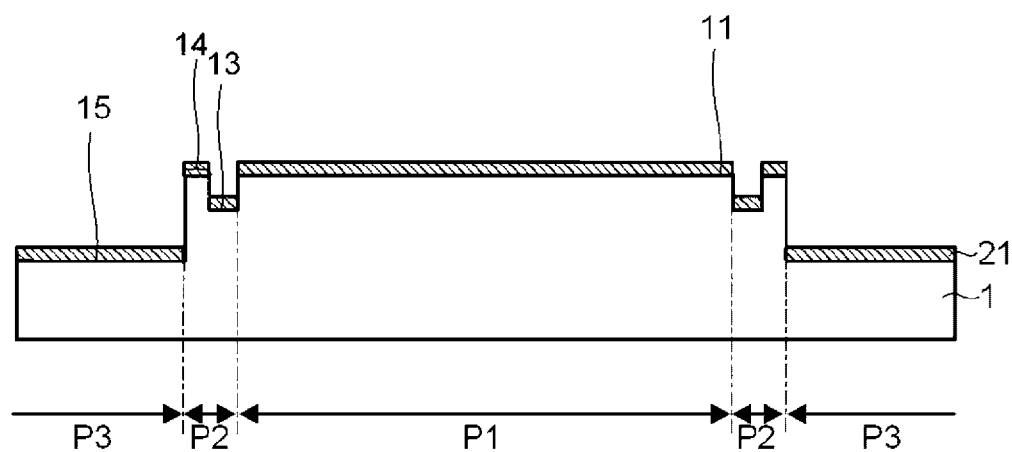
FIG. 18 is a sectional schematic view illustrating a method of manufacturing the template 10 shown in FIG. 3.
Figure 18:
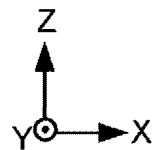

Next, as shown in FIG. 18, the optical layer 21 is formed on the face 11, the face 13, the protruding portion 14, and the face 15.

The optical layer 21 has a function as a hard mask for processing the substrate 1. The optical layer 21 can be formed using, for example, a material and a method applicable to the hard mask layer 32.

Figure 19:
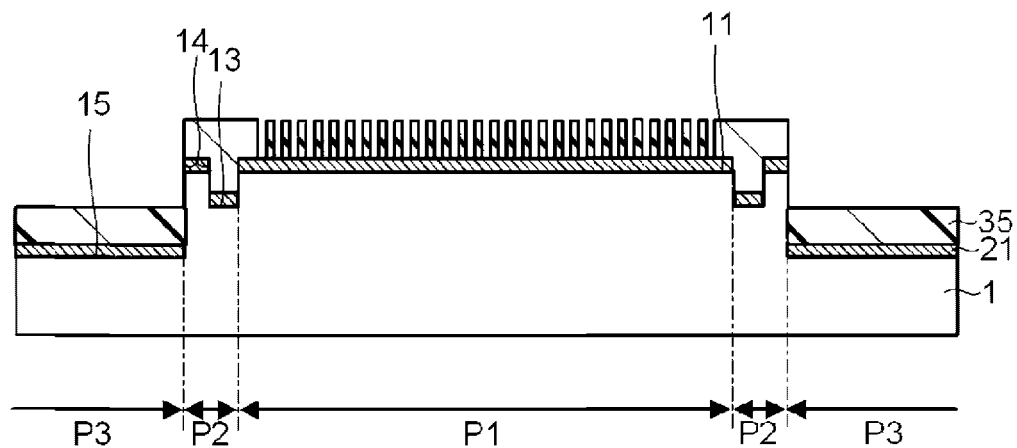
FIG. 19 is a sectional schematic view illustrating a method of manufacturing the template 10 shown in FIG. 3.
Figure 19:
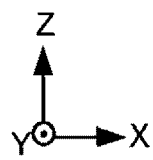

Next, as shown in FIG. 19, a resist mask layer 35 is formed on the optical layer 21.

The resist mask layer 35 has a function as a resist mask for processing the optical layer 21. The resist mask layer 35 has a pattern that causes a portion of the optical layer 21 coinciding with a region of the region P1 in which the irregular portion 12 is formed to be exposed. The resist mask layer 35 is formed using, for example, a pattern formation method in which NIL is used.

Figure 20:
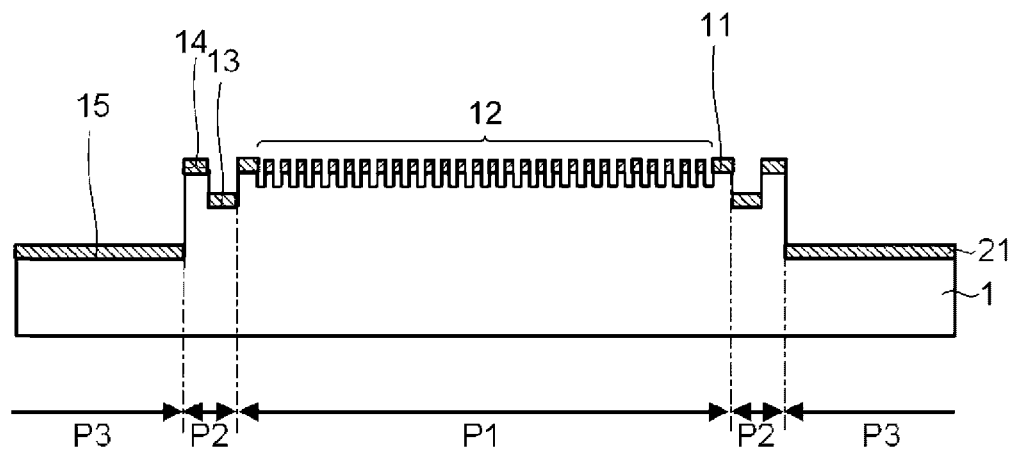
FIG. 20 is a sectional schematic view illustrating a method of manufacturing the template 10 shown in FIG. 3.
Figure 20:
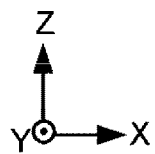

Next, an exposed portion of the optical layer 21 is removed, and one portion of the substrate 1 is removed in the thickness direction by an etching in which the optical layer 21 and the resist mask layer 35 are used as masks, whereby a device pattern including the irregular portion 12 is formed in the region P1, and the resist mask layer 35 is removed, as shown in FIG. 20. The substrate 1 may be partially removed using RIE, dry etching, or the like.

Figure 21:
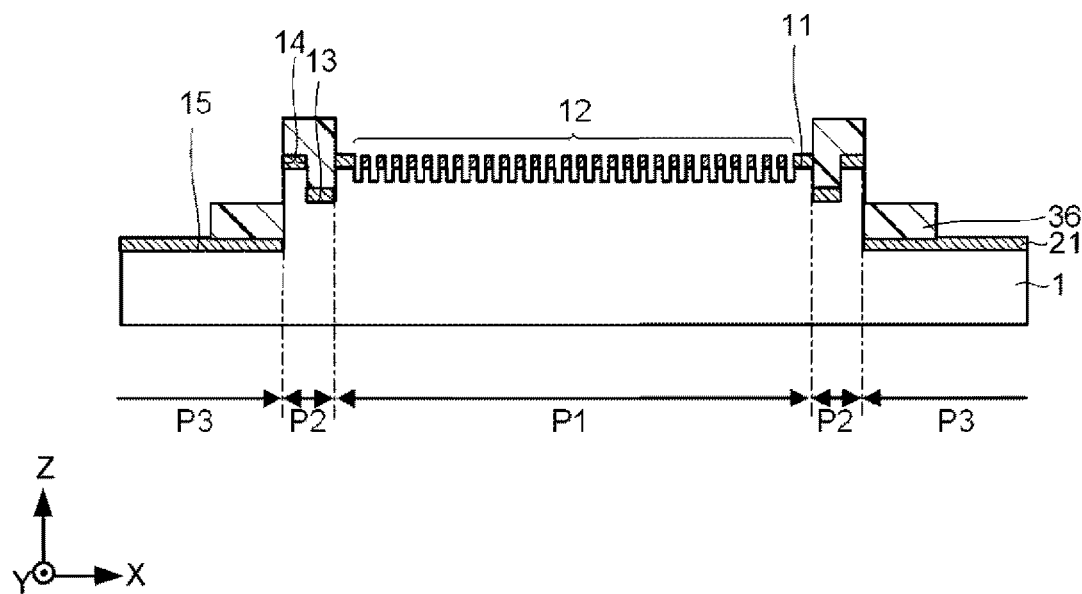
FIG. 21 is a sectional schematic view illustrating a method of manufacturing the template 10 shown in FIG. 3.

Next, as shown in FIG. 21, a resist mask layer 36 is formed on the optical layer 21.

The resist mask layer 36 has a function as a resist mask for processing the optical layer 21. The resist mask layer 36 has a pattern that causes a portion of the optical layer 21 coinciding with the irregular portion 12 of the region P1 to be exposed, covers the face 13 and the protruding portion 14 of the region P2, and causes one portion of the region P3 to be exposed. The resist mask layer 36 is formed using, for example, a pattern formation method in which NIL is used.

Figure 22:
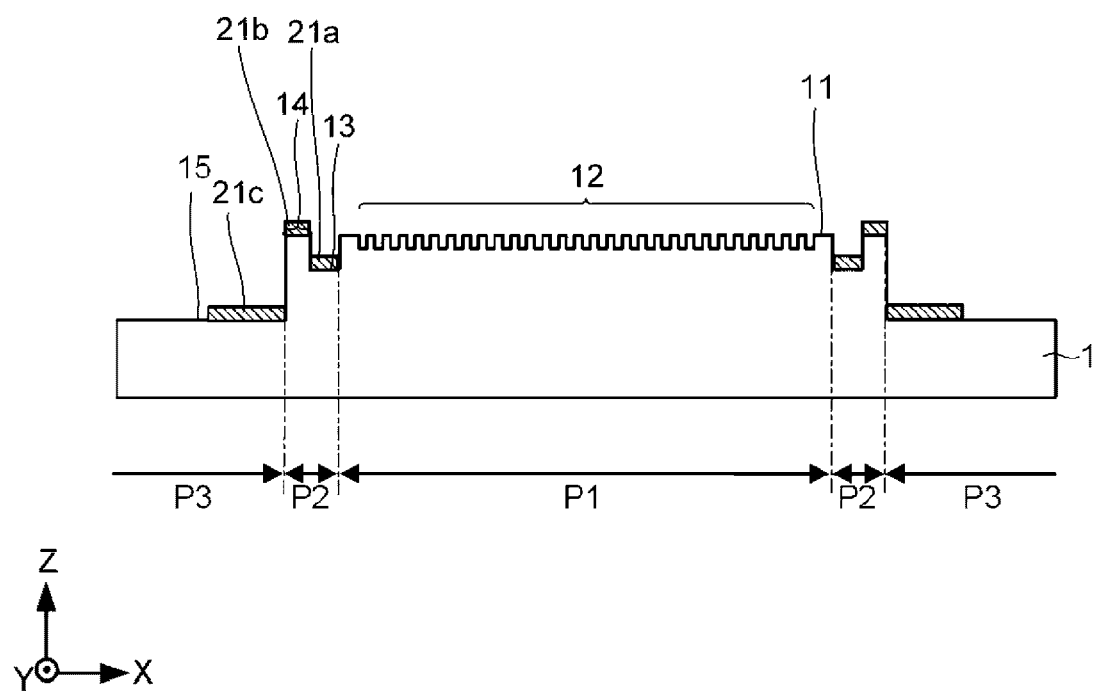
FIG. 22 is a sectional schematic view illustrating a method of manufacturing the template 10 shown in FIG. 3.

Next, one portion of the substrate 1 is removed in the thickness direction by an etching in which the resist mask layer 36 is used as a mask, whereby an exposed portion of the optical layer 21 is removed, forming the optical layer 21a, the optical layer 21b, and the optical layer 21c, and the resist mask layer 36 is removed, as shown in FIG. 22. The substrate 1 may be partially removed using RIE, dry etching, or the like. When one portion of the substrate 1 is removed by etching in an exposed portion of the irregular portion 12, a depth of a concave portion shown in FIG. 21 is greater than a depth of a concave portion of the irregular portion 12 shown in FIG. 22, but a depiction is omitted from FIG. 22 for the sake of convenience.

Figure 23:
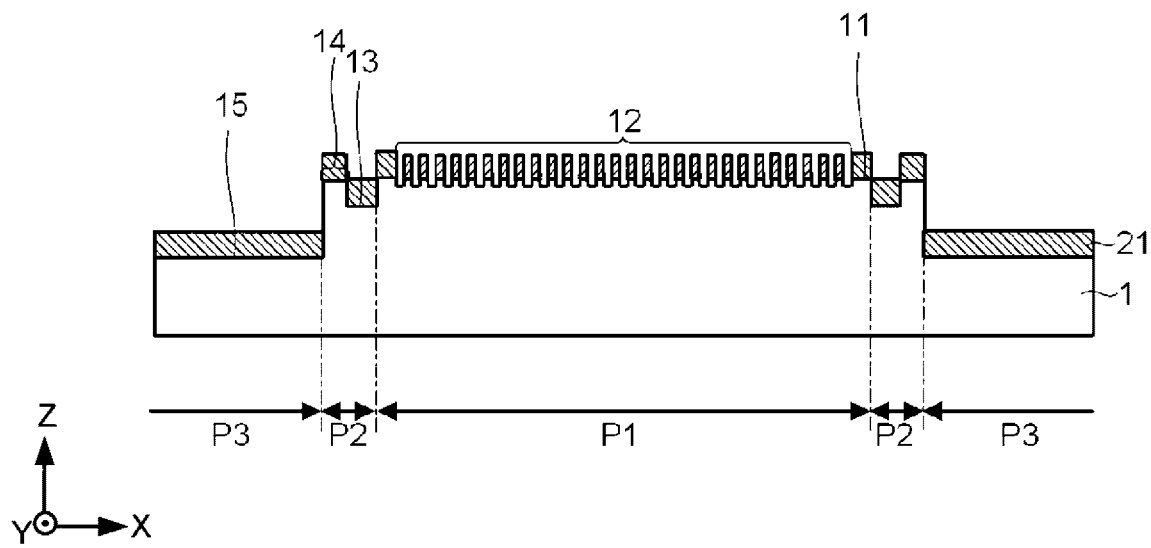
FIG. 23 is a sectional schematic view illustrating a method of manufacturing the template 10 shown in FIG. 3.
Figure 24:
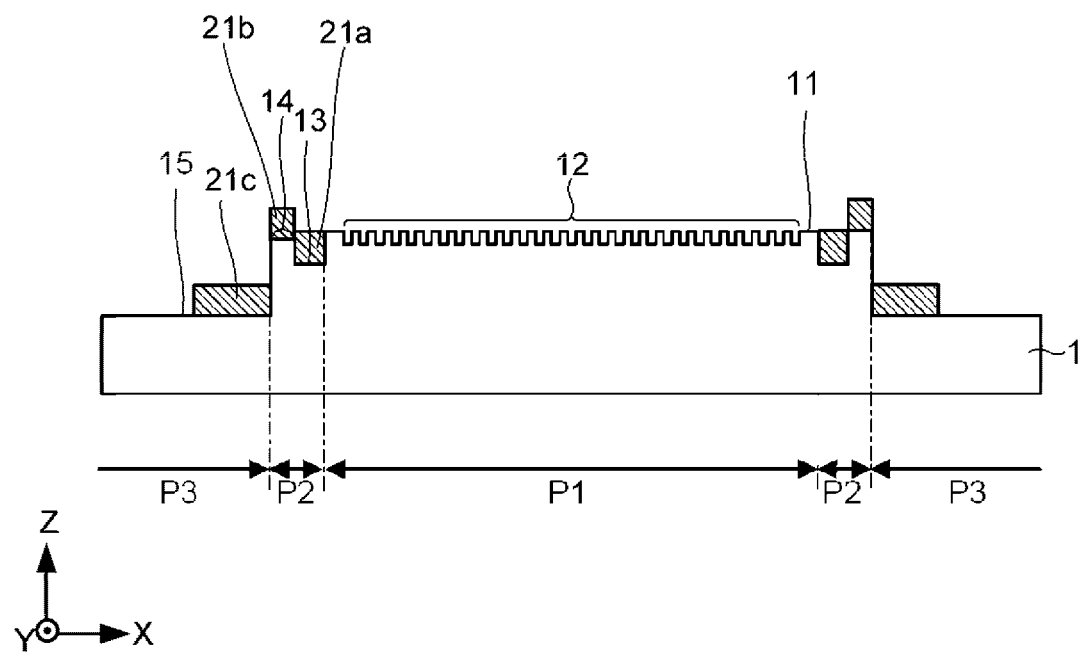
FIG. 24 is a sectional schematic view illustrating a method of manufacturing the template 10 shown in FIG. 3.

After the irregular portion 12 is formed using the optical layer 21 and the resist mask layer 35, and the resist mask layer 35 is removed, as shown in FIG. 20, the optical layer 21 may be thickened by depositing a material the same as that of the optical layer 21 on the optical layer 21, as shown in FIG. 23, before forming the resist mask layer 36 as shown in FIG. 21, and subsequently, an exposed portion of the optical layer 21 may be removed by an etching in which the resist mask layer 36 is used as a mask, forming the optical layer 21a, the optical layer 21b, and the optical layer 21c, and the resist mask layer 36 removed, as shown in FIG. 24. By so doing, for example, the optical layer 21a can be of a height approximately equivalent to that of the face 11, and an alignment mark corresponding to the optical layer 21a can also be formed simultaneously. In FIG. 23, a material the same as that of the optical layer 21 is also deposited in the concave portion of the irregular portion 12 when thickening the optical layer 21, but is subsequently removed using a process shown in FIG. 24.

Next, an example of a modification of the template 10 of the first embodiment will be described, with reference to FIGS. 25 to 28. FIGS. 25 to 28 are sectional schematic views for illustrating an example of a modification of the template 10 of the first embodiment. With regard to portions corresponding to the template 10 shown in FIG. 3 among portions of the template 10 shown in FIGS. 25 to 28, the description of the template 10 shown in FIG. 3 may be referred to as appropriate when necessary.

Figure 25:
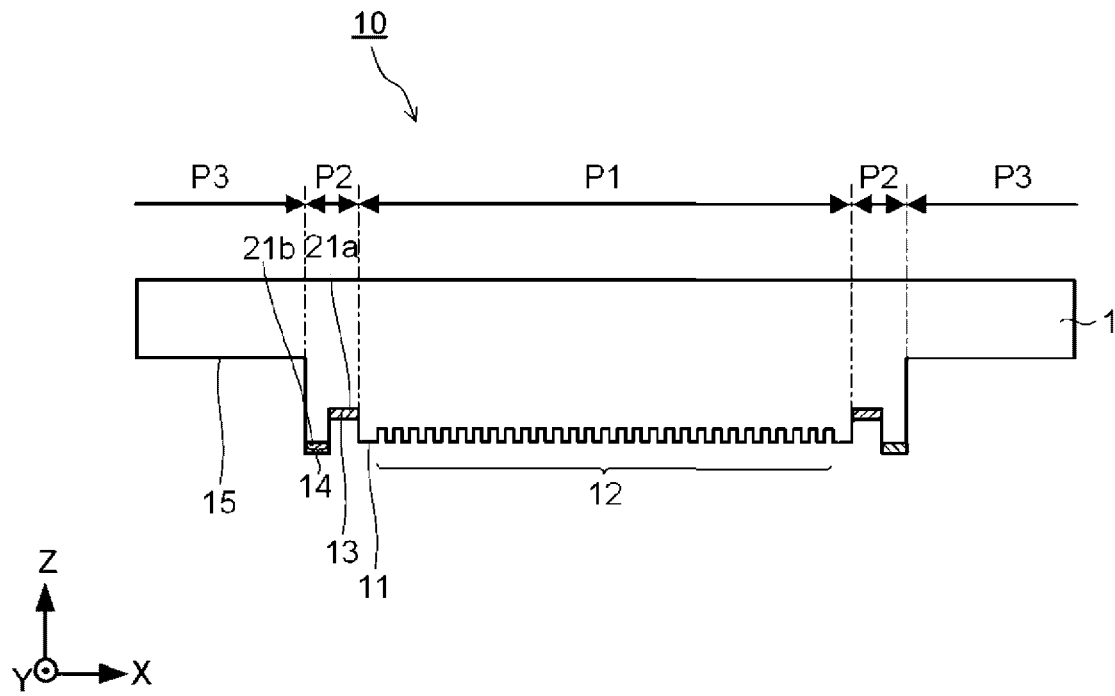
FIG. 25 is a sectional schematic view illustrating an example of a modification of the template of the first embodiment.
Figure 26:
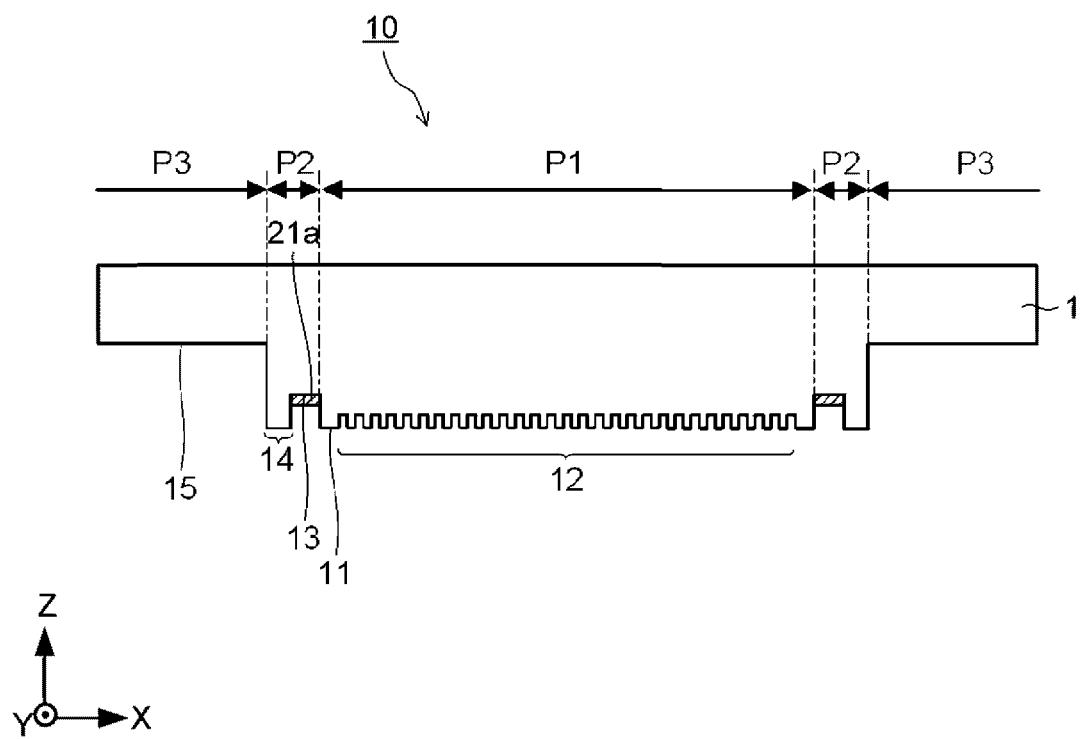
FIG. 26 is a sectional schematic view illustrating an example of a modification of the template of the first embodiment.
Figure 27:
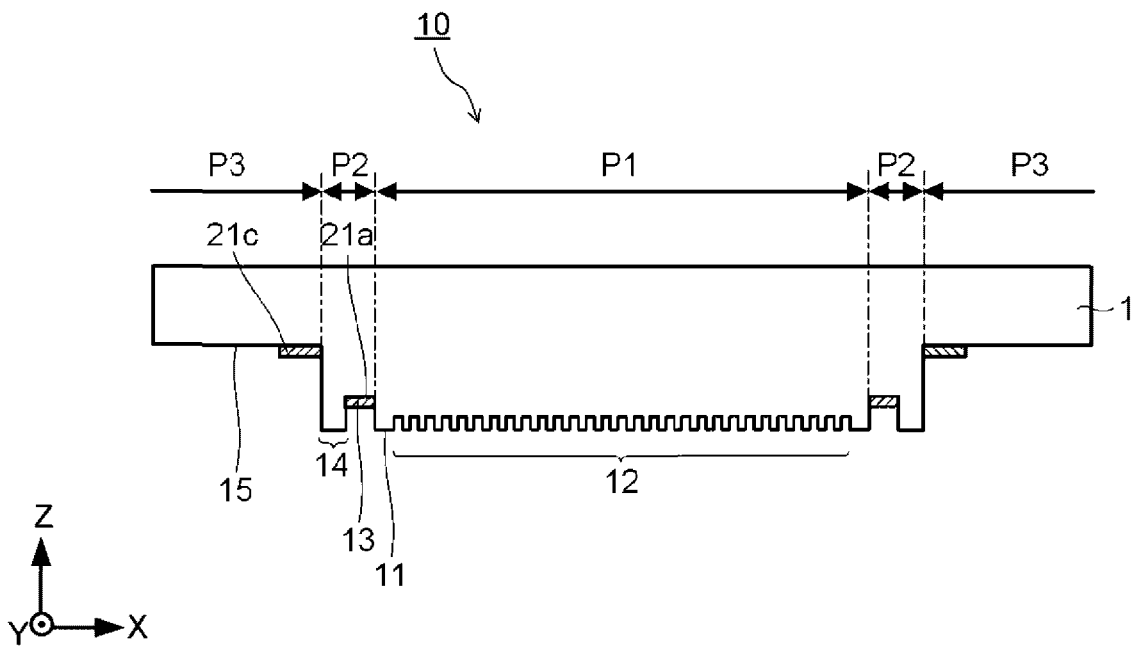
FIG. 27 is a sectional schematic view illustrating an example of a modification of the template of the first embodiment.

When compared with the template 10 shown in FIG. 3, the template 10 shown in FIG. 25 differs in that there is no optical layer 21c. When compared with the template 10 shown in FIG. 3, the template 10 shown in FIG. 26 differs in that there is no optical layer 21b or optical layer 21c. When compared with the template 10 shown in FIG. 3, the template 10 shown in FIG. 27 differs in that there is no optical layer 21b. In order to restrict curing of the region 102b when curing the region 102a2 shown in FIG. 10, it is sufficient to have at least the optical layer 21a.

Figure 28:
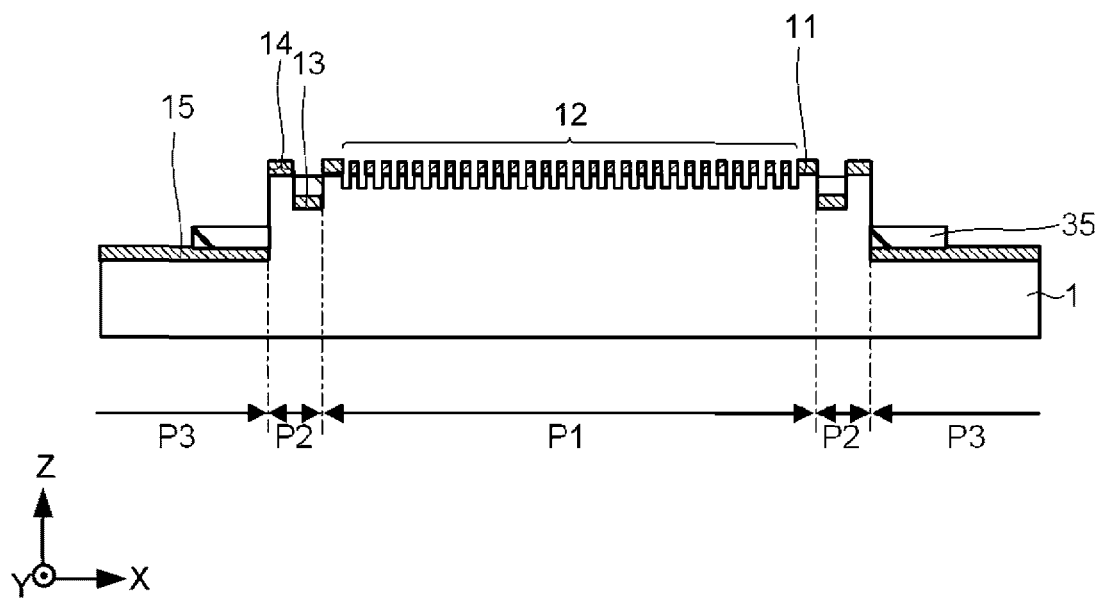
FIG. 28 is a sectional schematic view illustrating an example of a modification of the template of the first embodiment.

The optical layer 21b and the optical layer 21c can be removed by, for example, an etching by adjusting a pattern form of the resist mask layer 35 used in processing. Also, the optical layer 21b may be formed by, after the resist mask layer 36 is formed as shown in FIG. 21, partially removing the resist mask layer 36 in a thickness direction, causing a portion of the optical layer 21 coinciding with the protruding portion 14 to be exposed, and subsequently removing an exposed portion of the optical layer 21, as shown in FIG. 28.

Second Embodiment

Figure 29:
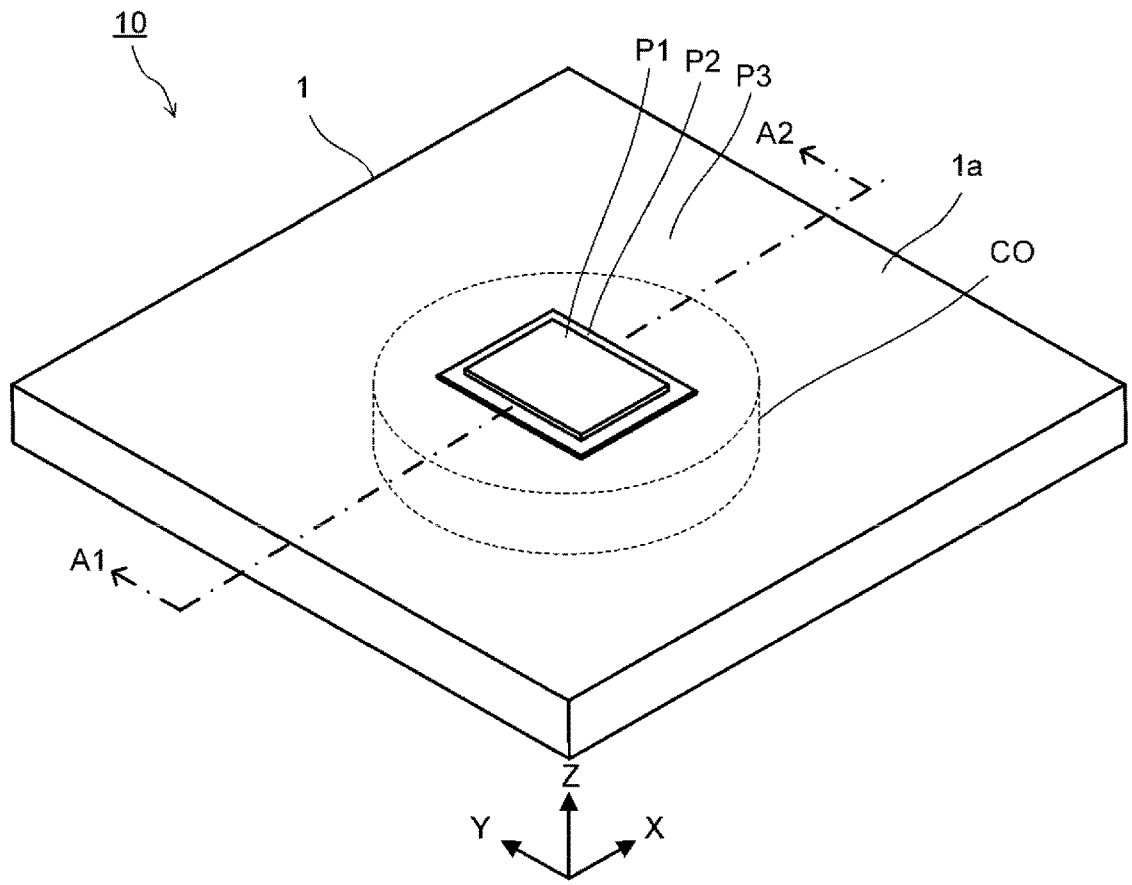
FIG. 29 is a perspective schematic view illustrating an example of a structure of a template of a second embodiment.
Figure 30:
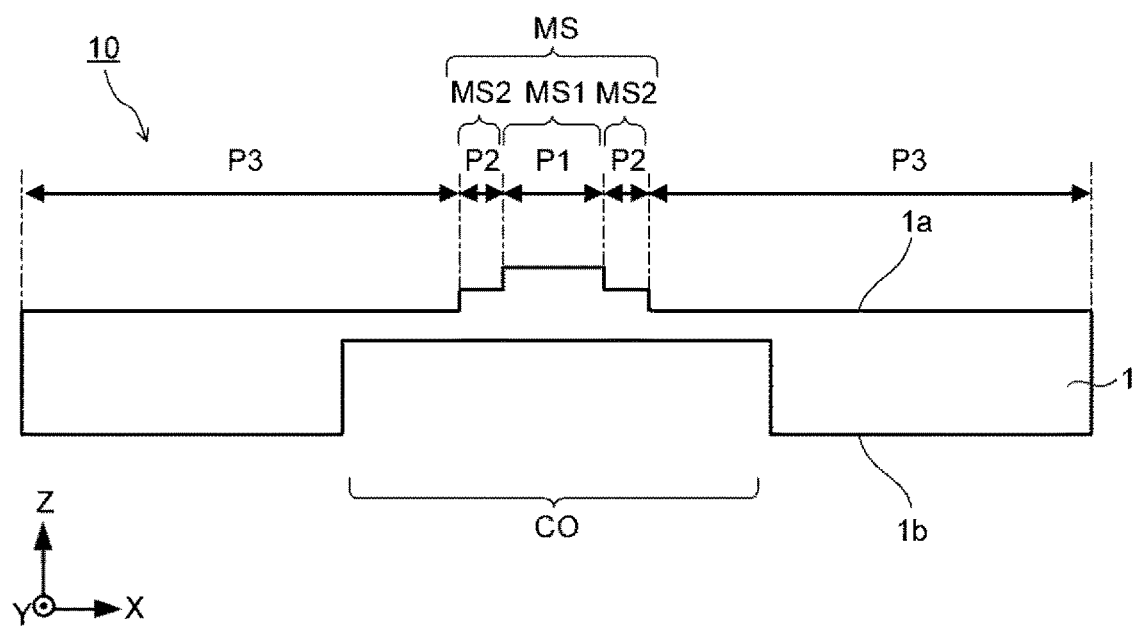
FIG. 30 is a sectional schematic view illustrating an example of a structure of the template of the second embodiment.

FIG. 29 is a perspective schematic view illustrating an example of a structure of a template of a second embodiment. FIG. 30 is a sectional schematic view illustrating an example of a structure of a template of the second embodiment. FIGS. 29 and 30 show an X-axis, a Y-axis perpendicular to the X-axis, and a Z-axis perpendicular to each of the X-axis and the Y-axis. FIG. 30 shows one portion of a cross-section of a line segment A1-A2 shown in FIG. 29.

When compared with the template 10 shown in FIGS. 1 and 2, the template 10 shown in FIGS. 29 and 30 differs in having a mesa portion MS1, which protrudes from the surface 1a, and a mesa portion MS2, which protrudes from the surface 1a and is provided farther downward (to the surface 1b side) than the mesa portion MS1. The mesa portion MS1 and the mesa portion MS2 form the mesa MS. With regard to portions of the template 10 shown in FIGS. 29 and 30 that correspond to portions of the template 10 shown in FIGS. 1 and 2, the description of the portions of the template 10 shown in FIGS. 1 and 2 may be referred to as necessary.

Figure 31:
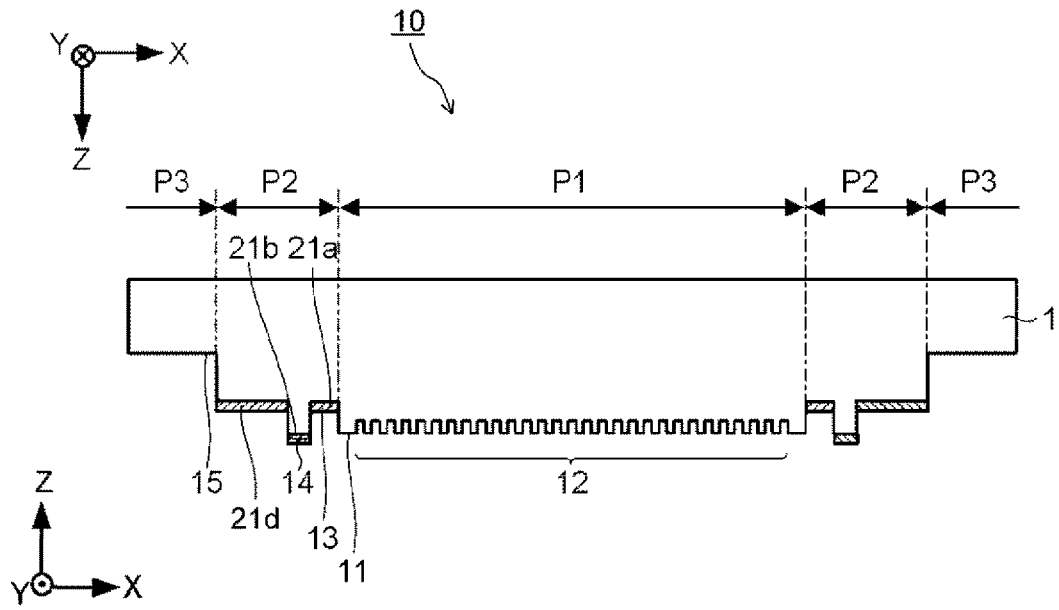
FIG. 31 is a sectional schematic view illustrating an example of a structure of the template of the second embodiment.
Figure 32:
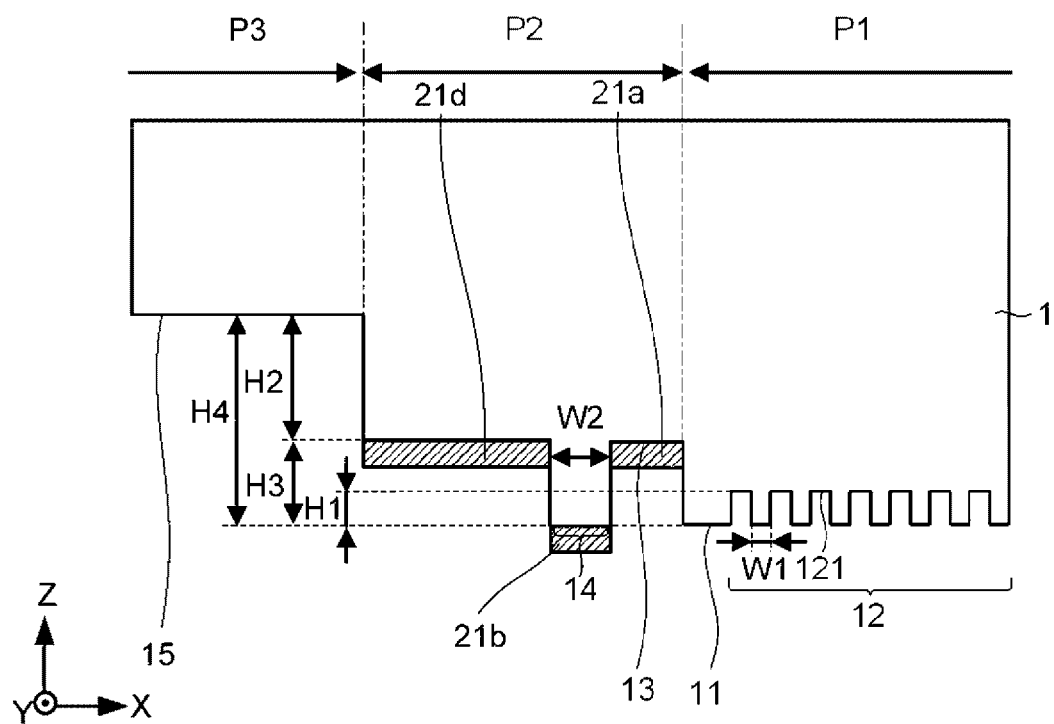
FIG. 32 is an enlarged schematic view showing one portion of FIG. 31.

FIG. 31 is a sectional schematic view illustrating an example of a structure of the template 10 of the second embodiment. FIG. 31 shows a section including the X-axis of the template 10 and the Z-axis of the template 10. FIG. 32 is an enlarged schematic view showing one portion of FIG. 31. A lower side of the substrate 1 in FIG. 31 represents an upper portion of the substrate 1, and an upper side of the substrate 1 in FIG. 31 represents a lower portion of the substrate 1.

The region P1 corresponds to the mesa portion MS1, and the region P2 corresponds to the mesa portion MS2. As shown in FIG. 29, the region P2 is provided around the region P1 as seen from the X-Y plane. As shown in FIG. 32, the region P2 has the face 13, the protruding portion 14, and the optical layer 21 (21a, 21b, and 21d).

As shown in FIG. 32, the face 13 is provided farther downward (to the surface 1b side) than the bottom face 121 of the irregular portion 12 when the face 11 is a reference face. Because of this, an arrangement can be such that when a template is pressed against a coating layer and the irregular portion 12 comes into contact with the coating layer, the coating layer does not come into contact with the face 13. When the mesa portion MS1 and the mesa portion MS2 are provided, as in the second embodiment, the face 13 extends from a region between the protruding portion 14 and the face 11 to a region between the protruding portion 14 and the face 15, and furthermore, extends to a peripheral edge portion of the region P2 (a peripheral edge portion of the mesa portion MS2). With regard to other descriptions of the face 13, the description of the face 13 of the first embodiment may be referred to as appropriate when necessary.

The protruding portion 14 is provided protruding from the face 13. The protruding portion 14 forms a dummy pattern. A form of the dummy pattern is not particularly limited, provided that the form has the protruding portion 14. A line and space pattern, a pillar pattern, and the like, are suggested as examples of a dummy pattern. The dummy pattern may have the layouts shown in FIGS. 5 and 6, in the same way as in the first embodiment. With regard to other descriptions of the protruding portion 14, the description of the protruding portion 14 of the first embodiment may be referred to as appropriate when necessary.

The optical layer 21a is provided in contact with the face 13. The optical layer 21b is provided in contact with the upper face of the protruding portion 14. An optical layer 21d is provided between the protruding portion 14 on the face 13 and the region P3. The optical layer 21a and the optical layer 21d may be one continuous film. The optical layer 21 is provided in the region P2, but is not provided in the region P1. That is, while the face 13 is in contact with the optical layer 21, the face 11 and the surface of the irregular portion 12 are not in contact with the optical layer 21, and form an exposed face. The optical layer 21 is preferably provided at least between the protruding portion 14 on the face 13 and the face 11. The optical layer 21 contains a second material applicable to the optical layer 21 of the first embodiment. The second materials of the optical layers 21a, 21b, and 21d may be the same as each other, or may differ. With regard to other descriptions of the optical layer 21, the description of the optical layer 21 of the first embodiment may be referred to as appropriate when necessary.

The region P3 is provided around the region P2. The region P3 has the face 15. The face 15 is provided farther downward (to the surface 1b side) than the face 13, with the face 11 as a reference face. With regard to other descriptions of the region P3, the description of the region P3 of the first embodiment may be referred to as appropriate when necessary.

Next, a pattern formation method in which the template 10 of the second embodiment is used will be described. The pattern formation method is such that first, in the same way as with the pattern formation method of the first embodiment, the coating layer 102 is formed on the target object 100, the template 10 is pressed against each of the multiple of regions 102a of the coating layer 102 in, for example, a predetermined order, thereby molding the region 102a, and the region 102a is cured by irradiating with light with the template 10 still pressed against the shaped region 102a.

Figure 33:
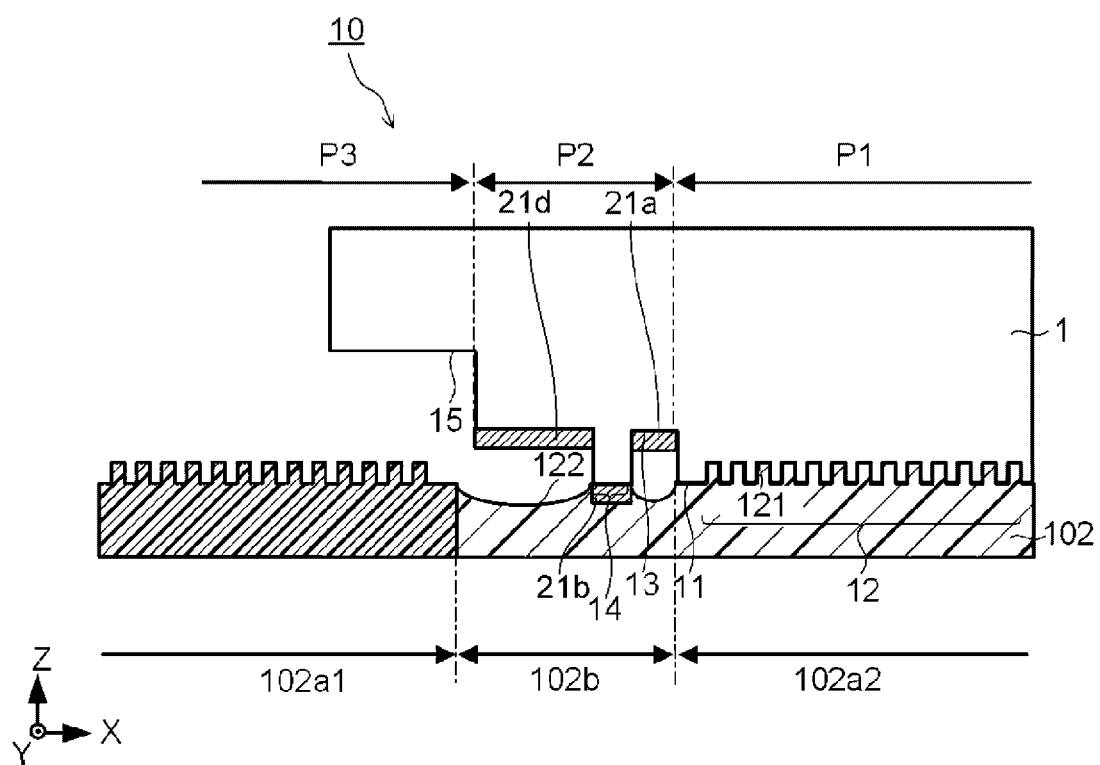
FIG. 33 is a schematic view illustrating a form of the coating layer 102 when the form of the template 10 is brought into contact with the coating layer 102.

FIG. 33 is a schematic view illustrating a change in the coating layer 102 when the template 10 is brought into contact with the coating layer 102. FIG. 33 shows the coating layer 102 and the template 10. With regard to portions corresponding to portions shown in FIG. 10 among portions shown in FIG. 33, the description of the portions shown in FIG. 10 may be referred to as appropriate when necessary.

When the template 10 has the region P2, as shown in FIG. 33, the region 102a2 is shaped by the region P1 coming into contact with the region 102a2 when the template 10 is pressed against the region 102a, together with which the protruding portion 14 comes into contact with the region 102a without the face 13 coming into contact with the region 102a1, the region 102a2, and the region 102b. Because of this, imprint material that comes into contact with the protruding portion 14 is liable to accumulate, a drawing to one side of imprint material due to surface tension is restricted, and the depression 122 can be reduced in size or eliminated. Therefore, a decrease in thickness of the region 102b after curing can be restricted. Therefore, a desired device pattern can be formed with high accuracy.

Subsequently, in the same way as with the pattern formation method of the first embodiment, the region 102a2 is cured by irradiating with light with the template 10 still pressed against the shaped region 102a2. At this time, curing of the region 102b can be restricted by the optical layer 21. After all the regions 102a are shaped and cured sequentially, the region 102b is cured by irradiating the region 102b with light. By so doing, the device pattern can be transferred to the region 102a. The above is a description of the pattern formation method of the second embodiment.

Next, an example of a method of manufacturing the template 10 shown in FIG. 31 will be described, with reference to FIGS. 34 to 45. FIGS. 34 to 45 are sectional schematic views for illustrating a method of manufacturing the template 10 shown in FIG. 31.

Figure 34:
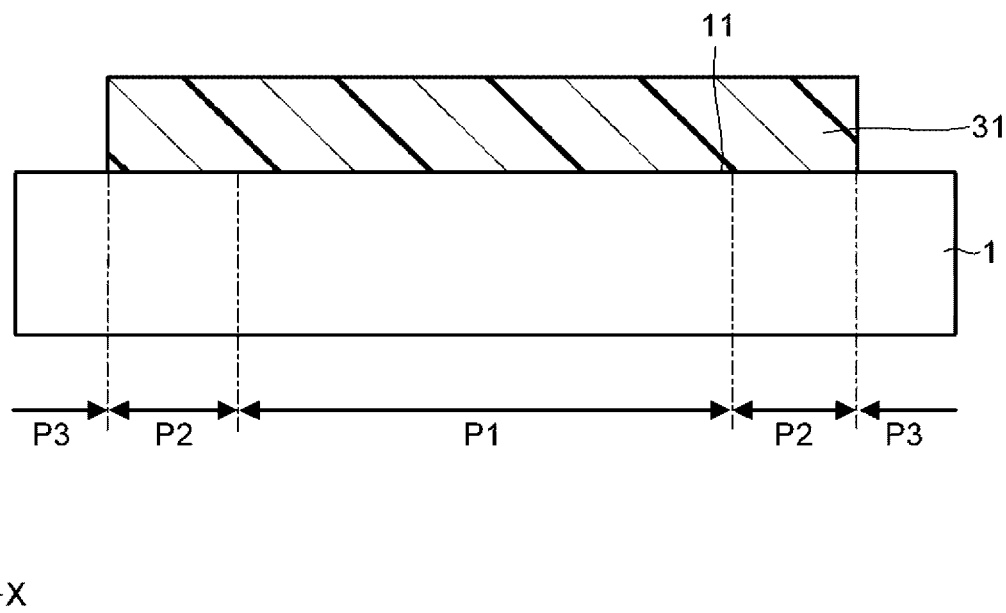
FIG. 34 is a sectional schematic view illustrating a method of manufacturing the template 10 shown in FIG. 31.

Firstly, as shown in FIG. 34, the resist mask layer 31 is formed on the face 11 of the substrate 1. The resist mask layer 31 covers the region P1 and the region P2, and causes the region P3 to be exposed. With regard to other portions of the resist mask layer 31 shown in FIG. 34, the description of the resist mask layer 31 of the first embodiment may be referred to as appropriate when necessary.

Figure 35:
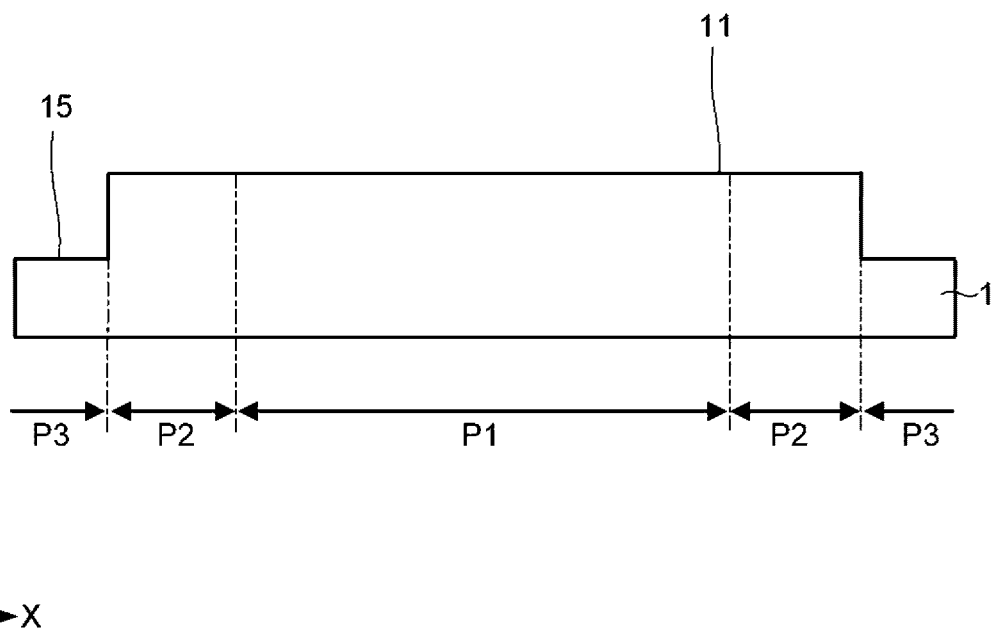
FIG. 35 is a sectional schematic view illustrating a method of manufacturing the template 10 shown in FIG. 31.

Next, one portion of the substrate 1 is removed in the thickness direction by an etching in which the resist mask layer 31 is used as a mask, whereby the mesa MS, including the region P1 and the region P2, and the face 15 are formed, and the resist mask layer 31 is removed, as shown in FIG. 35. The substrate 1 may be partially removed using, for example, the same method as in the first embodiment.

Figure 36:
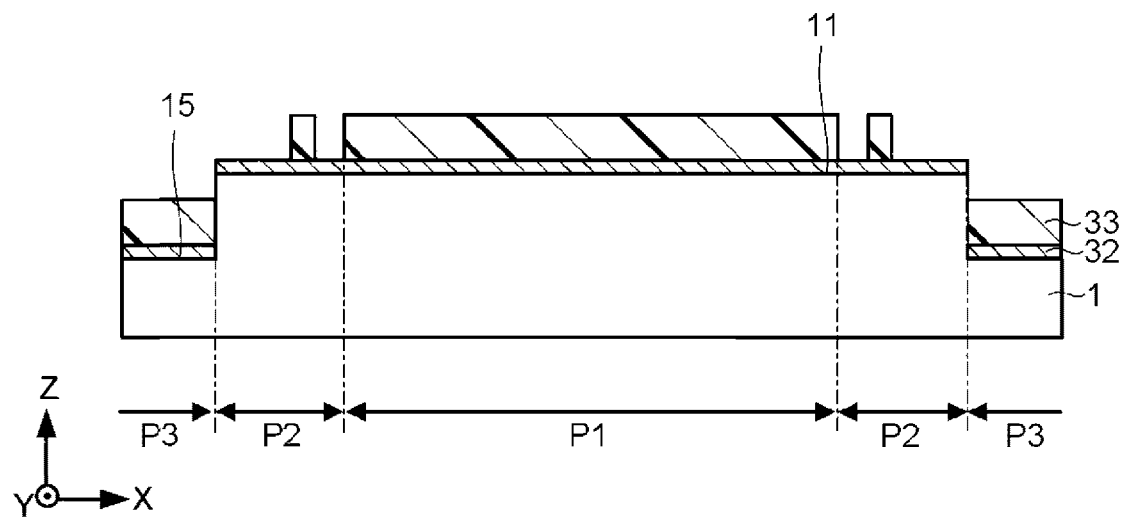
FIG. 36 is a sectional schematic view illustrating a method of manufacturing the template 10 shown in FIG. 31.

Next, as shown in FIG. 36, the hard mask layer 32 is formed on the face 11 and the face 15, and the resist mask layer 33 is formed on the hard mask layer 32. With regard to the hard mask layer 32, the description of the hard mask layer 32 of the first embodiment may be referred to as appropriate when necessary.

The resist mask layer 33 has a pattern that causes a portion of the hard mask layer 32 coinciding with a partial region of the face 11 of the region P2 to be exposed. With regard to other portions of the resist mask layer 33 shown in FIG. 36, the description of the resist mask layer 33 of the first embodiment may be referred to as appropriate when necessary.

Figure 37:
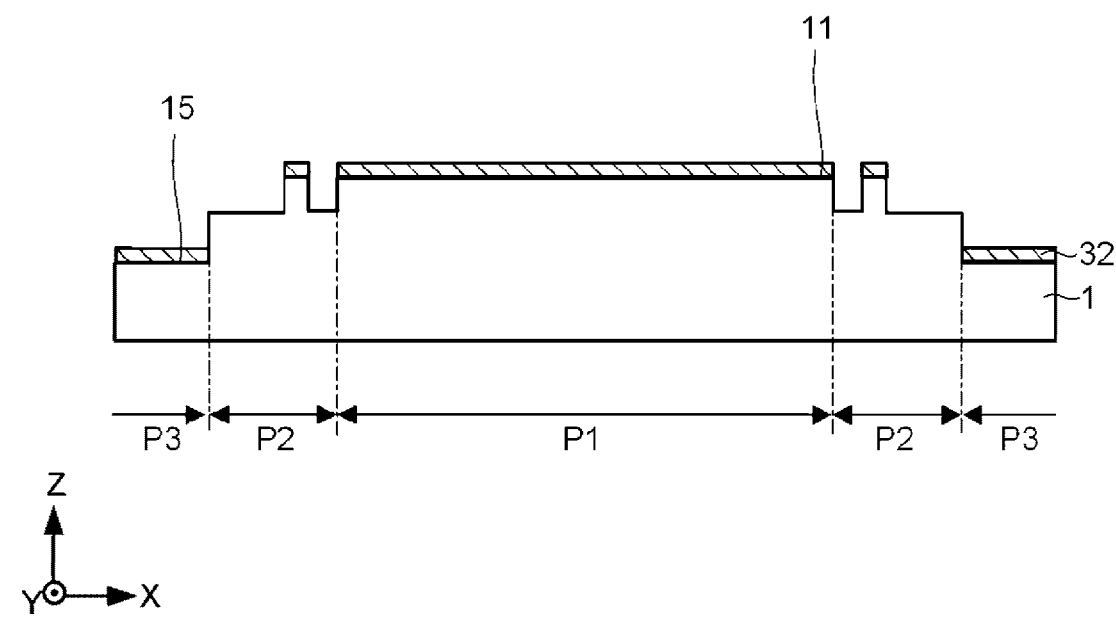
FIG. 37 is a sectional schematic view illustrating a method of manufacturing the template 10 shown in FIG. 31.

Next, an exposed portion of the hard mask layer 32 is removed, and one portion of the substrate 1 is removed in the thickness direction by an etching in which the hard mask layer 32 and the resist mask layer 33 are used as masks, whereby a dummy pattern including the face 13 and the protruding portion 14 is formed in the region P2, and the resist mask layer 33 is removed, as shown in FIG. 37. By so doing, the mesa portion MS1 and the mesa portion MS2 can be formed. The substrate 1 may be partially removed using, for example, the same method as in the first embodiment.

Figure 38:
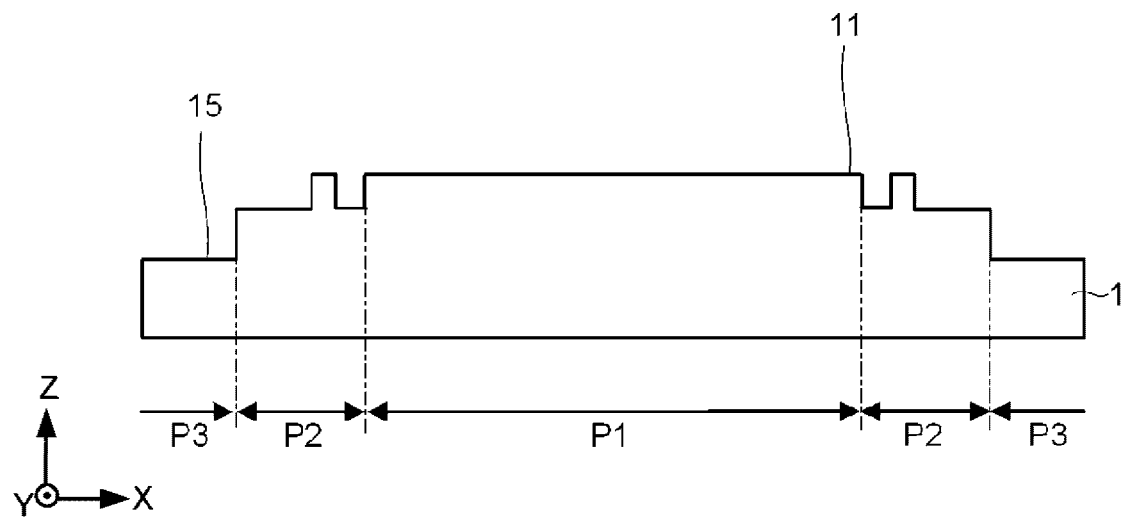
FIG. 38 is a sectional schematic view illustrating a method of manufacturing the template 10 shown in FIG. 31.

Next, as shown in FIG. 38, the hard mask layer 32 is removed. The hard mask layer 32 can be removed using, for example, the same method as in the first embodiment.

Figure 39:
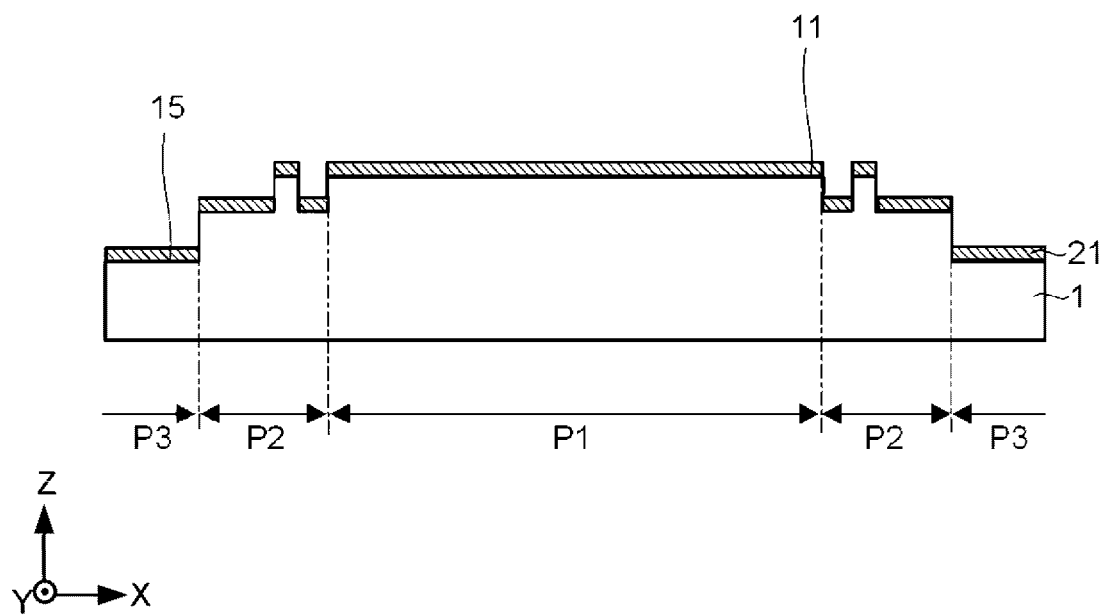
FIG. 39 is a sectional schematic view illustrating a method of manufacturing the template 10 shown in FIG. 31.

Next, as shown in FIG. 39, the optical layer 21 is formed on the face 11, the face 13, the protruding portion 14, and the face 15. With regard to the optical layer 21 shown in FIG. 39, the description of the optical layer 21 of the first embodiment may be referred to as appropriate when necessary.

Figure 40:
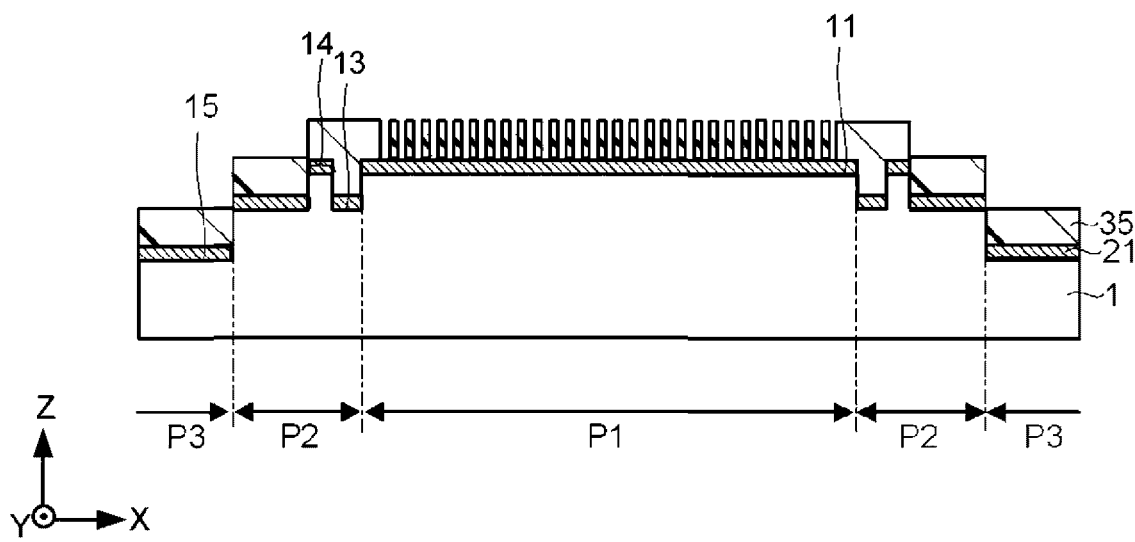
FIG. 40 is a sectional schematic view illustrating a method of manufacturing the template 10 shown in FIG. 31.

Next, as shown in FIG. 40, the resist mask layer 35 is formed on the optical layer 21. With regard to the resist mask layer 35 shown in FIG. 40, the description of the resist mask layer 35 of the first embodiment may be referred to as appropriate when necessary.

Figure 41:
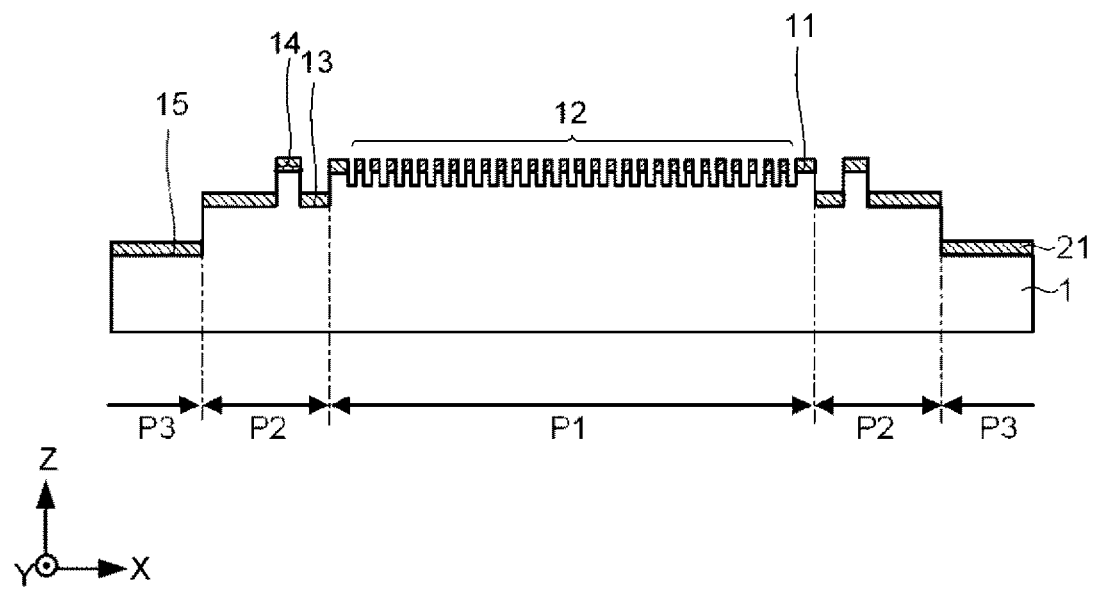
FIG. 41 is a sectional schematic view illustrating a method of manufacturing the template 10 shown in FIG. 31.

Next, an exposed portion of the optical layer 21 is removed, and one portion of the substrate 1 is removed in the thickness direction by an etching in which the optical layer 21 and the resist mask layer 35 are used as masks, whereby a device pattern including the irregular portion 12 is formed in the region P1, and the resist mask layer 35 is removed, as shown in FIG. 41. The substrate 1 may be partially removed using, for example, the same method as in the first embodiment.

Figure 42:
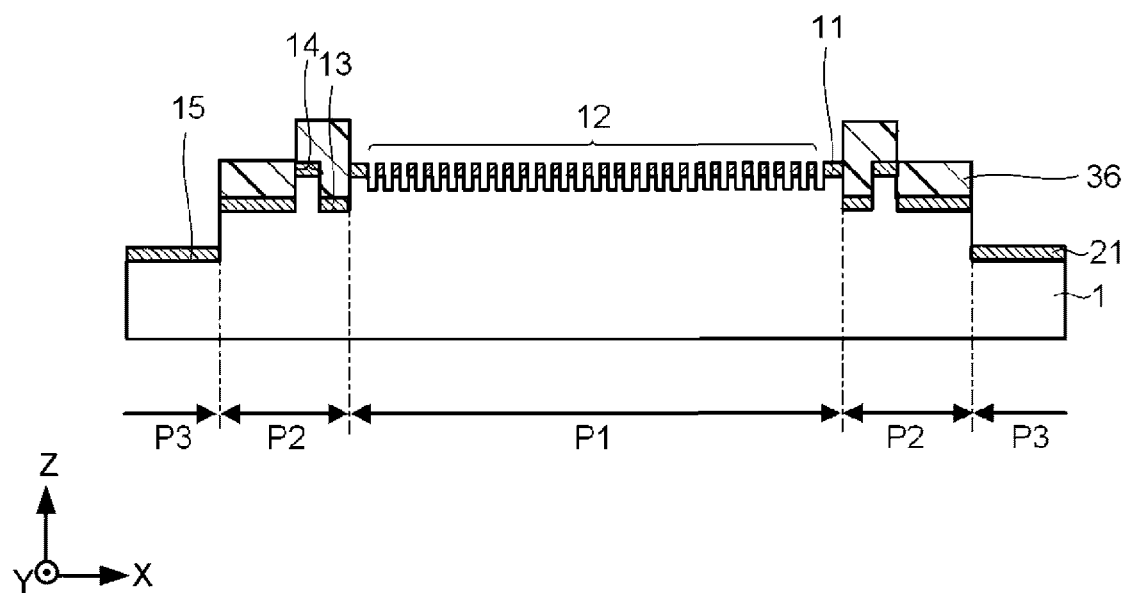
FIG. 42 is a sectional schematic view illustrating a method of manufacturing the template 10 shown in FIG. 31.

Next, as shown in FIG. 42, the resist mask layer 36 is formed on the optical layer 21. With regard to a description of the resist mask layer 36, the description of the resist mask layer 36 of the first embodiment may be referred to as appropriate when necessary.

Figure 43:
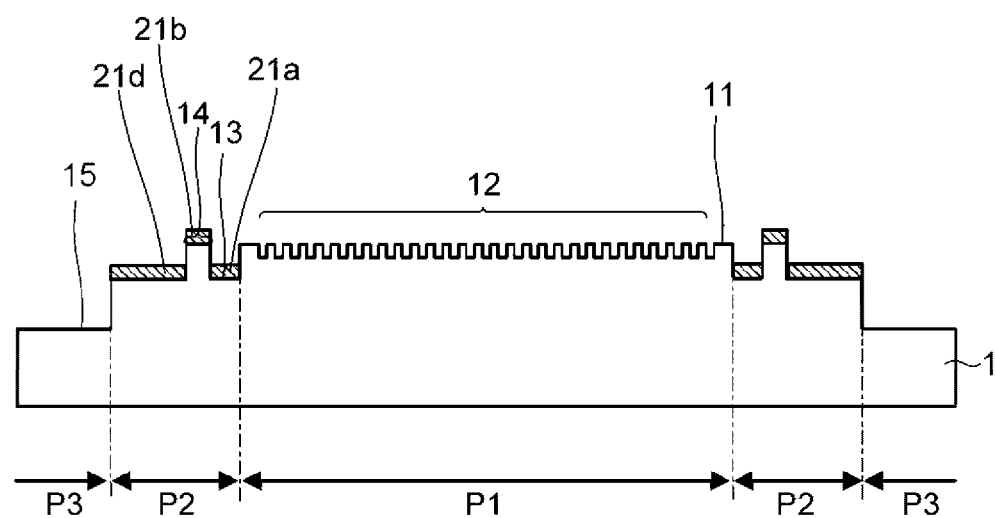
FIG. 43 is a sectional schematic view illustrating a method of manufacturing the template 10 shown in FIG. 31.

Next, one portion of the substrate 1 is removed in the thickness direction by an etching in which the resist mask layer 36 is used as a mask, whereby an exposed portion of the optical layer 21 is removed, forming the optical layer 21a, the optical layer 21b, and the optical layer 21d, and the resist mask layer 36 is removed, as shown in FIG. 43. The substrate 1 may be partially removed using, for example, the same method as in the first embodiment. When one portion of the substrate 1 is removed by etching in an exposed portion of the irregular portion 12, a depth of a concave portion shown in FIG. 42 is greater than a depth of a concave portion of the irregular portion 12 shown in FIG. 43, but a depiction is omitted from FIG. 43 for the sake of convenience.

Figure 44:
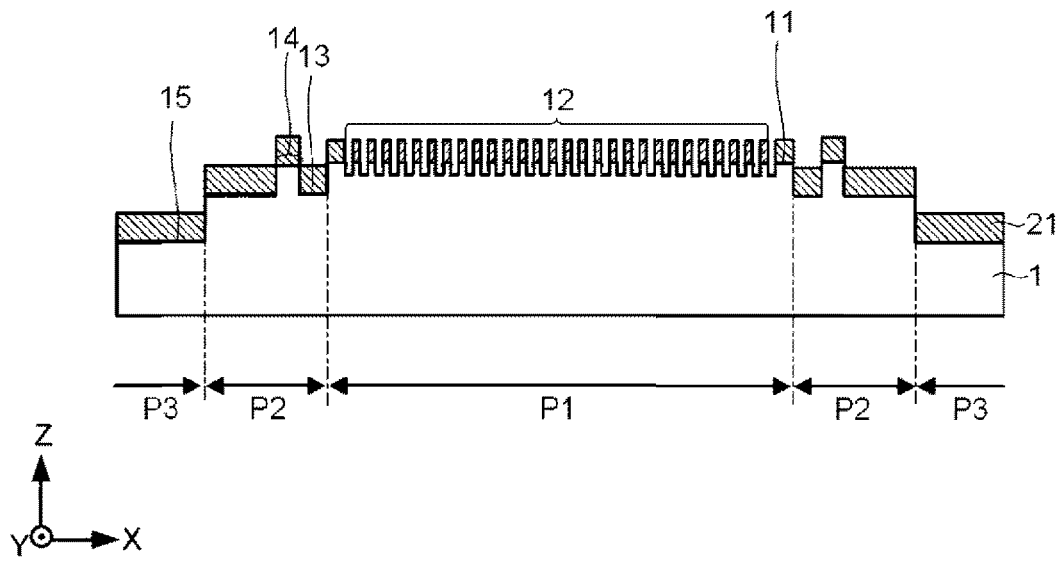
FIG. 44 is a sectional schematic view illustrating a method of manufacturing the template 10 shown in FIG. 31.
Figure 45:
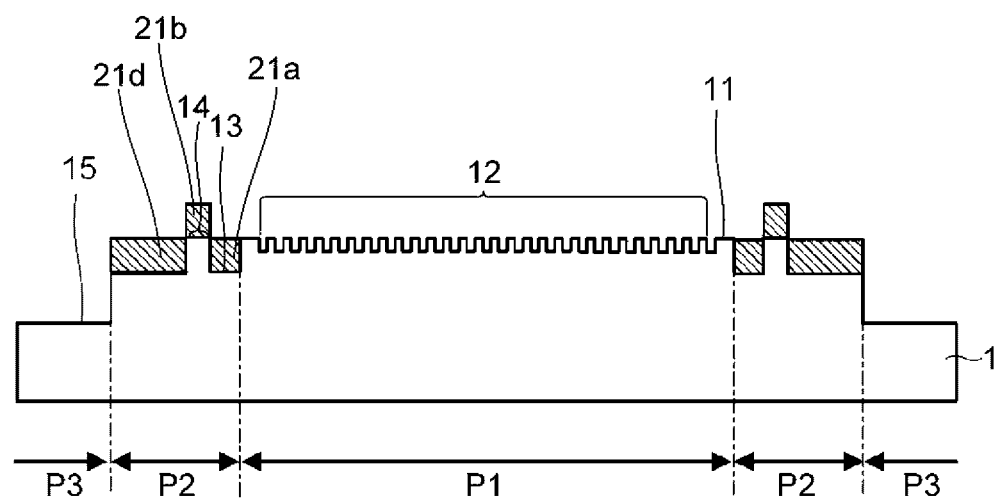
FIG. 45 is a sectional schematic view illustrating a method of manufacturing the template 10 shown in FIG. 31.

After the irregular portion 12 is formed using the optical layer 21 and the resist mask layer 35, and the resist mask layer 35 is removed, as shown in FIG. 41, the optical layer 21 may be thickened by depositing a material the same as that of the optical layer 21 on the optical layer 21, as shown in FIG. 44, before forming the resist mask layer 36 as shown in FIG. 42, and subsequently, an exposed portion of the optical layer 21 may be removed by an etching in which the resist mask layer 36 is used as a mask, forming the optical layer 21a, the optical layer 21b, and the optical layer 21d, and the resist mask layer 36 removed, as shown in FIG. 45. By so doing, for example, the optical layer 21a can be of a height approximately equivalent to that of the face 11, and an alignment mark corresponding to the optical layer 21a can also be formed simultaneously. In FIG. 41, a material the same as that of the optical layer 21 is also deposited in the concave portion of the irregular portion 12 when thickening the optical layer 21, but is subsequently removed using a process shown in FIG. 45.

Next, an example of a modification of the template of the second embodiment will be described, with reference to FIGS. 46 to 49. FIGS. 46 to 49 are sectional schematic views for illustrating an example of a modification of the template of the second embodiment. With regard to portions corresponding to the template 10 shown in FIG. 31 among portions of the template 10 shown in FIGS. 46 to 49, the description of the template 10 shown in FIG. 31 may be referred to as appropriate when necessary.

Figure 46:
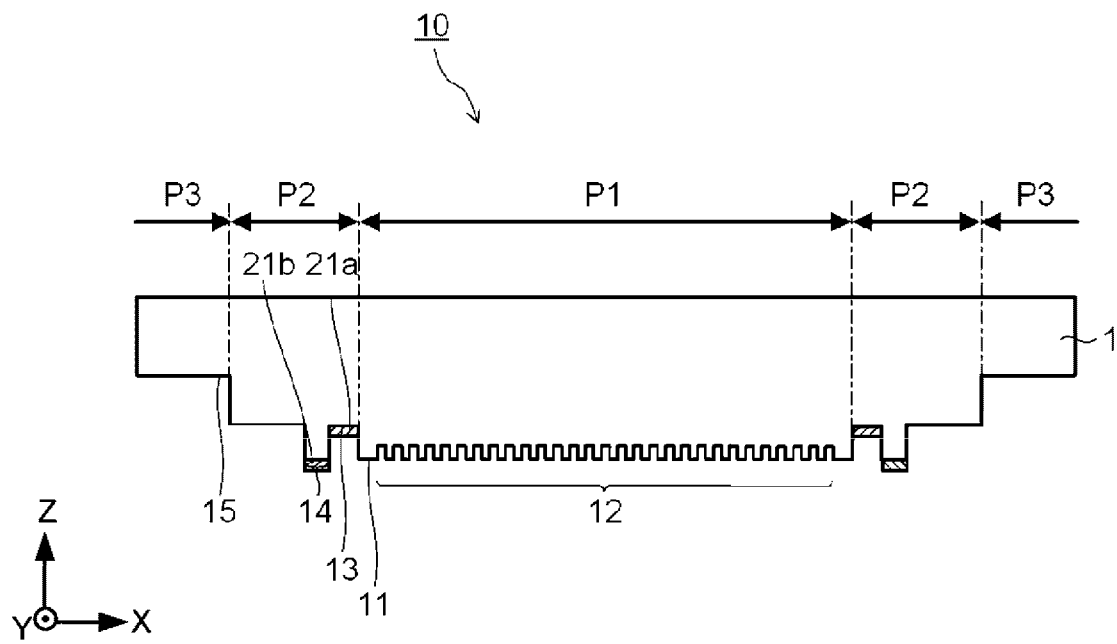
FIG. 46 is a sectional schematic view illustrating a method of manufacturing the template 10 shown in FIG. 31.
Figure 47:
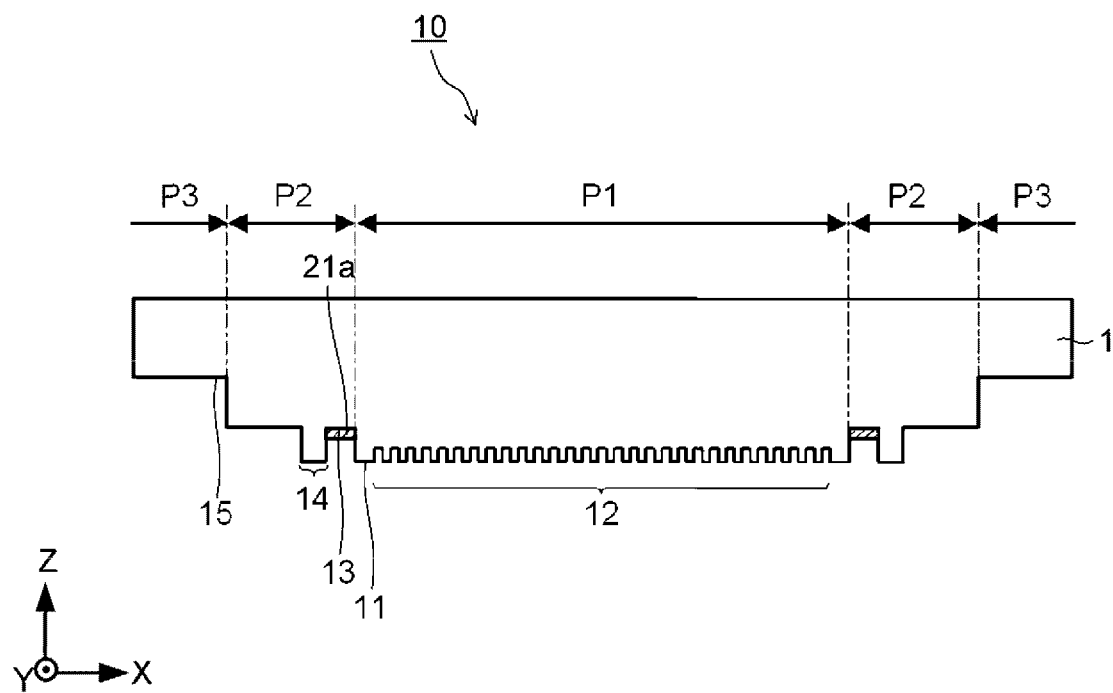
FIG. 47 is a sectional schematic view illustrating a method of manufacturing the template 10 shown in FIG. 31.
Figure 48:
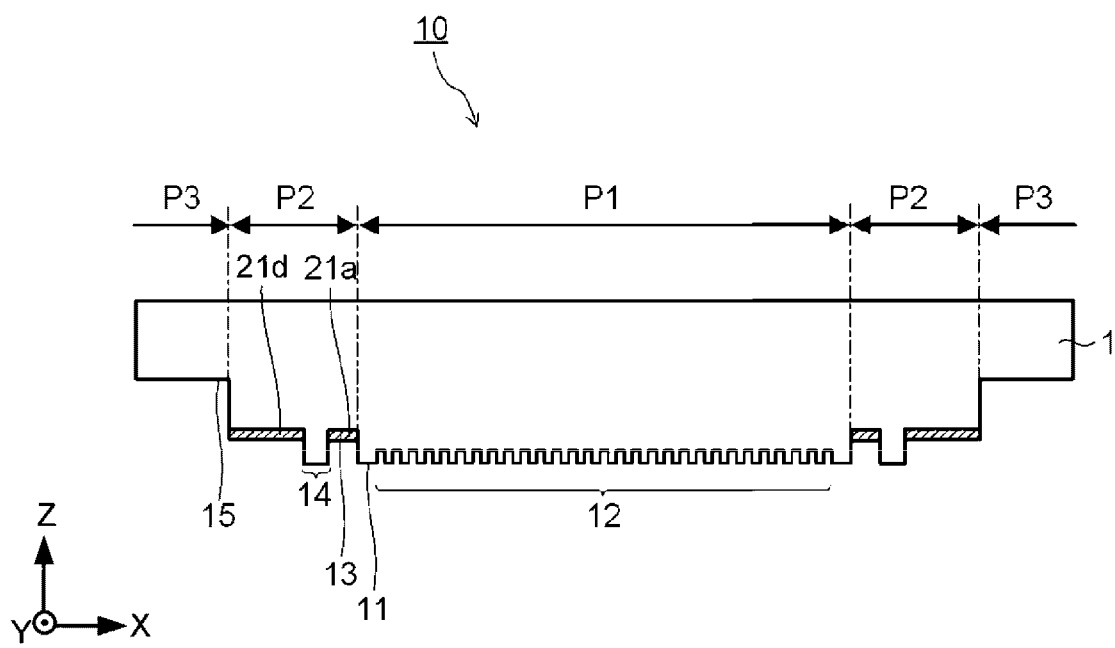
FIG. 48 is a sectional schematic view illustrating a method of manufacturing the template 10 shown in FIG. 31.

When compared with the template 10 shown in FIG. 31, the template 10 shown in FIG. 46 differs in that there is no optical layer 21d. When compared with the template 10 shown in FIG. 31, the template 10 shown in FIG. 47 differs in that there is no optical layer 21b or optical layer 21d. When compared with the template 10 shown in FIG. 31, the template 10 shown in FIG. 48 differs in that there is no optical layer 21b. In order to restrict curing of the region 102b when curing the region 102a2 shown in FIG. 33, it is sufficient to have at least a region of the optical layer 21a between the protruding portion 14 and the face 11.

Figure 49:
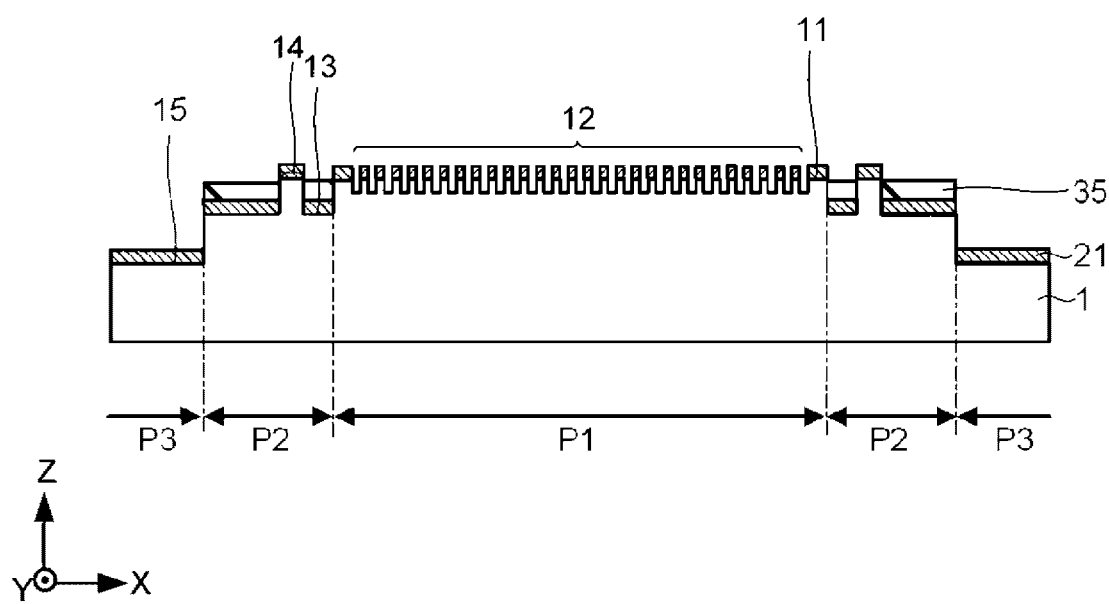
FIG. 49 is a sectional schematic view illustrating a method of manufacturing the template 10 shown in FIG. 31.

The optical layer 21b and the optical layer 21d can be removed by, for example, an etching by adjusting a pattern form of the resist mask layer 35 used in processing. Also, the optical layer 21b may be formed by, after the resist mask layer 36 is formed as shown in FIG. 42, partially removing the resist mask layer 36 in the thickness direction, causing a portion of the optical layer 21 coinciding with the protruding portion 14 to be exposed, and subsequently removing an exposed portion of the optical layer 21, as shown in FIG. 49.

Third Embodiment

Figure 50:
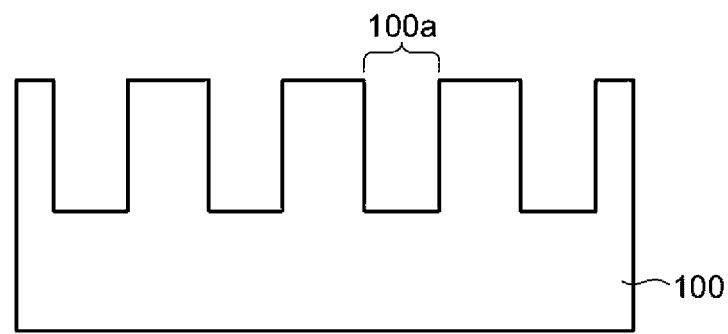
FIG. 50 is a sectional schematic view illustrating an example of a semiconductor device manufacturing method.
Figure 50:
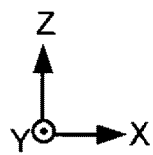
Figure 51:
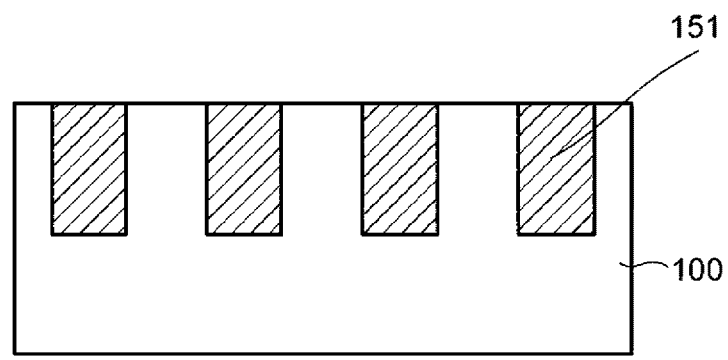
FIG. 51 is a sectional schematic view illustrating an example of a semiconductor device manufacturing method.
Figure 51:
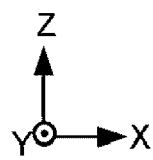

FIGS. 50 and 51 are sectional schematic views for illustrating a semiconductor device manufacturing method. One portion of the target object 100 is processed using a cured layer of the coating layer 102 formed using the pattern formation methods of the first embodiment or the second embodiment, whereby, for example, a concave portion 100a is formed, as shown in FIG. 50. The target object 100 is processed by stacked layers configuring the target object 100 being partially removed by, for example, dry etching, and a form of the target object 100 after processing is determined in accordance with a device pattern.

Next, as shown in FIG. 51, a film (a film to be processed) is formed on the target object 100, and a layer 151 is formed in the concave portion 100a by processing the film. The layer 151 is a conductive layer containing, for example, a metal material. The layer 151 has a function as, for example, embedded wiring.

As heretofore described, the semiconductor device manufacturing method example of the present embodiment is such that a semiconductor device can be manufactured by processing the target object 100 using a cured layer of a coating layer formed in accordance with the pattern formation method of either of the first embodiment and the second embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A template, comprising:
   a first region having a first face and a first pattern, the first region being an opposite side to a main face, the first pattern including a convex-concave portion disposed on the first face; and
   a second region, disposed around the first region, having a second face and a second pattern, the second face being the opposite side to the main face,
   the second pattern including a protruding portion protruding from the second face, and an optical layer disposed on the second face and the second pattern, wherein a height of the protruding portion from the second face is larger than a height of a convex portion of the convex-concave portion.

2. The template according to claim 1, further comprising a third region, disposed around the second region, the third region having a third face on the opposite side to the main face, wherein
   a height of the first face from the third face is larger than the height of the protruding portion from the second face.

3. The template according to claim 1, wherein the optical layer is disposed between the protruding portion and the first region.

4. The template according to claim 1, wherein the optical layer has at least one of chromium, molybdenum, tantalum, tungsten, zirconium, or titanium.

5. The template according to claim 1, wherein the second pattern is a pillar pattern or a line and stripe pattern.

6. The template according to claim 1, wherein the first pattern is a device pattern and the second pattern is a dummy pattern.

7. The template according to claim 1, wherein the optical layer includes a plurality of optical layers.

8. The template according to claim 7, wherein the plurality of optical layers are formed of different materials.

9. The template according to claim 2, wherein the optical layer includes a plurality of optical sublayers.

10. The template according to claim 9, wherein none of the plurality of optical layers are in the third region.

11. The template according to claim 1, wherein an upper surface of the protruding portion and an upper surface of the first face are at a same level, and the optical layer is formed on the upper surface of the protruding portion.

12. The template according to claim 1, wherein a width of a convex portion of the concave-convex portion is smaller than a width of the protruding portion.

13. The template according to claim 1, wherein the optical layer is further formed on the third face.

14. The template according to claim 12, wherein the width of the protruding portion is 0.1 μm or greater, and 5 μm or less.

* * * * *